(12) United States Patent
Lee et al.

(10) Patent No.: US 11,710,715 B2
(45) Date of Patent: Jul. 25, 2023

(54) SEMICONDUCTOR PACKAGE

(71) Applicant: Samsung Electronics Co., Ltd., Suwon-si (KR)

(72) Inventors: Joo Hyung Lee, Seongnam-si (KR); Ki Tae Park, Cheonan-si (KR); Byung Lyul Park, Seoul (KR); Joon Seok Oh, Seoul (KR); Jong Ho Yun, Daegu (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 152 days.

(21) Appl. No.: 17/208,005

(22) Filed: Mar. 22, 2021

(65) Prior Publication Data

US 2021/0384153 A1 Dec. 9, 2021

(30) Foreign Application Priority Data

Jun. 9, 2020 (KR) .................. 10-2020-0069557

(51) Int. Cl.
| | |
|---|---|
| *H01L 25/10* | (2006.01) |
| *H01L 23/00* | (2006.01) |
| *H01L 25/18* | (2023.01) |
| *H01L 23/498* | (2006.01) |
| *H01L 23/31* | (2006.01) |

(52) U.S. Cl.
CPC .............. *H01L 24/24* (2013.01); *H01L 24/05* (2013.01); *H01L 24/25* (2013.01); *H01L 25/105* (2013.01); *H01L 25/18* (2013.01); *H01L 23/3107* (2013.01); *H01L 23/49822* (2013.01); *H01L 24/13* (2013.01); *H01L 2224/0401* (2013.01); *H01L 2224/13024* (2013.01); *H01L 2224/2405* (2013.01); *H01L 2224/2413* (2013.01); *H01L 2224/24155* (2013.01); *H01L 2224/2505* (2013.01); *H01L 2224/25171* (2013.01); *H01L 2224/25174* (2013.01); *H01L 2224/82101* (2013.01); *H01L 2224/82106* (2013.01);

(Continued)

(58) Field of Classification Search
CPC ......... H01L 24/24; H01L 24/05; H01L 24/25; H01L 25/105; H01L 25/18
See application file for complete search history.

(56) References Cited

U.S. PATENT DOCUMENTS

| | | |
|---|---|---|
| 6,699,782 B2 | 3/2004 | Kim |
| 7,846,618 B2 | 12/2010 | Chai et al. |

(Continued)

FOREIGN PATENT DOCUMENTS

| | | |
|---|---|---|
| KR | 101216849 B1 | 12/2012 |
| KR | 101255616 B1 | 4/2013 |

OTHER PUBLICATIONS

US 9,461,180, 10/2015, Honda et al. (withdrawn).

*Primary Examiner* — Nathan W Ha
(74) *Attorney, Agent, or Firm* — Harness, Dickey & Pierce, P.L.C.

(57) ABSTRACT

A semiconductor package includes an insulating layer including a first face and a second face opposite each other, a redistribution pattern including a wiring region and a via region in the insulating layer, the wiring region being on the via region, and a first semiconductor chip connected to the redistribution pattern. The first semiconductor chip may be on the redistribution pattern. An upper face of the wiring region may be coplanar with the first face of the insulating layer.

20 Claims, 20 Drawing Sheets

(52) U.S. Cl.
CPC ............... *H01L 2225/1035* (2013.01); *H01L 2225/1041* (2013.01); *H01L 2225/1058* (2013.01)

(56) References Cited

U.S. PATENT DOCUMENTS

| | | | |
|---|---|---|---|
| 8,178,376 B2 | 5/2012 | Fang et al. | |
| 8,399,801 B2 | 3/2013 | Oh et al. | |
| 9,035,468 B2 | 5/2015 | Shih et al. | |
| 9,812,426 B1* | 11/2017 | Wang | H01L 24/02 |
| 10,187,998 B2 | 1/2019 | Rawlings et al. | |
| RE48,111 E * | 7/2020 | Pagaila | H01L 25/03 |
| 2009/0090915 A1 | 4/2009 | Yamazaki et al. | |
| 2017/0256511 A1* | 9/2017 | Kim | H01L 23/3114 |
| 2018/0033770 A1* | 2/2018 | Hsu | H01L 24/18 |
| 2018/0033782 A1* | 2/2018 | Jeng | H01L 21/76802 |
| 2018/0122774 A1* | 5/2018 | Huang | H01L 21/561 |
| 2018/0151502 A1* | 5/2018 | Lin | H01L 24/13 |
| 2018/0151530 A1* | 5/2018 | Chen | H01L 24/14 |
| 2018/0174994 A1* | 6/2018 | Choi | H01L 24/20 |
| 2018/0226349 A1* | 8/2018 | Yu | H01L 25/50 |
| 2019/0096841 A1* | 3/2019 | Liu | H01L 24/25 |
| 2019/0096864 A1* | 3/2019 | Huitema | H01L 33/62 |
| 2019/0131269 A1* | 5/2019 | Lee | H01L 24/25 |
| 2019/0131283 A1* | 5/2019 | Chen | H01L 24/19 |
| 2019/0148302 A1* | 5/2019 | Tseng | H01L 23/5385 257/774 |
| 2019/0157208 A1* | 5/2019 | Lin | H01L 23/5383 |
| 2019/0164783 A1* | 5/2019 | Huang | H01L 24/20 |
| 2019/0172809 A1* | 6/2019 | Oh | H01L 24/20 |
| 2019/0207304 A1* | 7/2019 | Kim | H01L 23/552 |
| 2019/0244947 A1* | 8/2019 | Yu | H01L 21/56 |
| 2019/0304803 A1* | 10/2019 | Hu | H01L 23/49822 |
| 2019/0326264 A1* | 10/2019 | Shen | H01L 23/5389 |
| 2019/0371734 A1* | 12/2019 | Chang | H01L 24/83 |
| 2020/0135453 A1* | 4/2020 | Liu | H01L 24/14 |
| 2020/0135669 A1* | 4/2020 | Liang | H01L 24/20 |
| 2020/0185330 A1* | 6/2020 | Yu | H01L 24/92 |
| 2020/0203303 A1* | 6/2020 | Lin | H01L 23/49816 |
| 2020/0243448 A1* | 7/2020 | Qian | H01L 23/5389 |
| 2020/0251438 A1* | 8/2020 | Wang | H01L 24/24 |
| 2020/0357730 A1* | 11/2020 | Tsai | H01L 24/97 |
| 2020/0395308 A1* | 12/2020 | Wu | H01L 23/3128 |
| 2020/0402965 A1* | 12/2020 | Ng | H01L 24/81 |
| 2021/0082825 A1* | 3/2021 | Strong | H01L 23/5386 |
| 2021/0118811 A1* | 4/2021 | Lu | H01L 23/5389 |
| 2021/0193589 A1* | 6/2021 | Pei | H01L 24/82 |
| 2021/0193609 A1* | 6/2021 | Hwang | H01L 24/92 |
| 2021/0257311 A1* | 8/2021 | Hsieh | H01L 23/552 |
| 2021/0272929 A1* | 9/2021 | Tsai | H01L 24/82 |
| 2021/0305226 A1* | 9/2021 | Tsai | H01L 25/0657 |
| 2021/0343674 A1* | 11/2021 | Wang | H01L 21/4803 |
| 2021/0375708 A1* | 12/2021 | Kuo | H01L 25/16 |
| 2022/0238474 A1* | 7/2022 | Abe | H01L 21/486 |

\* cited by examiner

SEMICONDUCTOR PACKAGE

CROSS-REFERENCE TO RELATED APPLICATIONS

This application claims priority under 35 U.S.C. § 119 to Korean Patent Application No. 10-2020-0069557, filed on Jun. 9, 2020 in the Korean Intellectual Property Office, the disclosure of which is incorporated by reference herein in its entirety.

TECHNICAL FIELD

Example embodiments of the present disclosure relate to a semiconductor package.

DISCUSSION OF RELATED ART

Semiconductor packaging is a process of packaging a semiconductor chip (or a semiconductor die) to electrically connect the semiconductor chip and an electronic device. As the size of a semiconductor chip has decreased, a semiconductor package has been proposed in which an input/output terminal is placed outside the semiconductor chip by the use of a redistribution layer. For example, a fan-in wafer level package (FIWLP) type semiconductor package, a fan-out wafer level package (FOWLP) type semiconductor package, a fan-out panel level package (FOPLP) type semiconductor package, and the like have been proposed.

On the other hand, the redistribution layer includes a wiring region and a via region, and is formed through a photolithography process. Arranging the wiring region and the via region may be necessary at the time of the process.

SUMMARY

Aspects of the present disclosure provide a semiconductor package including a redistribution pattern that is positively aligned.

Aspects of the present disclosure also provide a method for fabricating a semiconductor package including a redistribution pattern that is positively aligned.

According to an example embodiment of the present disclosure, a semiconductor package may include an insulating layer, a redistribution pattern, and a first semiconductor chip. The insulating layer may include a first face and a second face opposite each other. The redistribution pattern may include a wiring region and a via region in the insulating layer. The wiring region may be on the via region. The first semiconductor chip may be connected to the redistribution pattern and may be on the redistribution pattern. An upper face of the wiring region may be coplanar with the first face of the insulating layer.

According to an example embodiment, a semiconductor package may include an insulating layer, a redistribution pattern, and a semiconductor chip. The insulating layer may be a single layer. The insulating layer may include a via trench and a wiring trench. The via trench may include a first side wall and a second side wall opposite each other. The wiring trench may include a third side wall and a fourth side wall opposite each other. At least one of the first side wall and the second side wall of the via trench may be directly connected to at least one of the third side wall and the fourth side wall of the wiring trench. The redistribution pattern may include a via region in the via trench and a wiring region in the wiring trench. The semiconductor chip may be on the redistribution pattern and connected to the redistribution pattern.

According to an example embodiment of the present disclosure, a semiconductor package includes may include a redistribution structure including a first face and a second face opposite each other, a core layer on the second face of the redistribution structure, a semiconductor chip, and a solder ball. The redistribution structure may include a first insulating layer, a first redistribution pattern in the first insulating layer, a second insulating layer on the first insulating layer, and a second redistribution pattern in the second insulating layer. The first redistribution pattern may include a first via region and a first wiring region in the first insulating layer. The first via region may be on the first wiring region. The second redistribution pattern may include a second via region and a second wiring region in the second insulating layer. The second via region may be on the second wiring region and connected to the first wiring region. In a direction from the second face toward the first face, an upper face of the first wiring region may be coplanar with the first face of the redistribution structure. In the direction from the second face toward the first face, an upper face of the second wiring region may be coplanar with the upper face of the second insulating layer. The first insulating layer and the second insulating layer each may be a single layer. The first insulating layer and the second insulating layer may include a photo imagable dielectric. The core layer may include a core wiring layer, a core insulating layer wrapping around the core wiring layer, and a cavity exposing at least a part of the second face of the redistribution structure. The semiconductor chip may be in the cavity of the core layer and may be connected to the redistribution structure. The first via region may be connected to the semiconductor chip. The solder ball may be on the second face of the redistribution structure.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
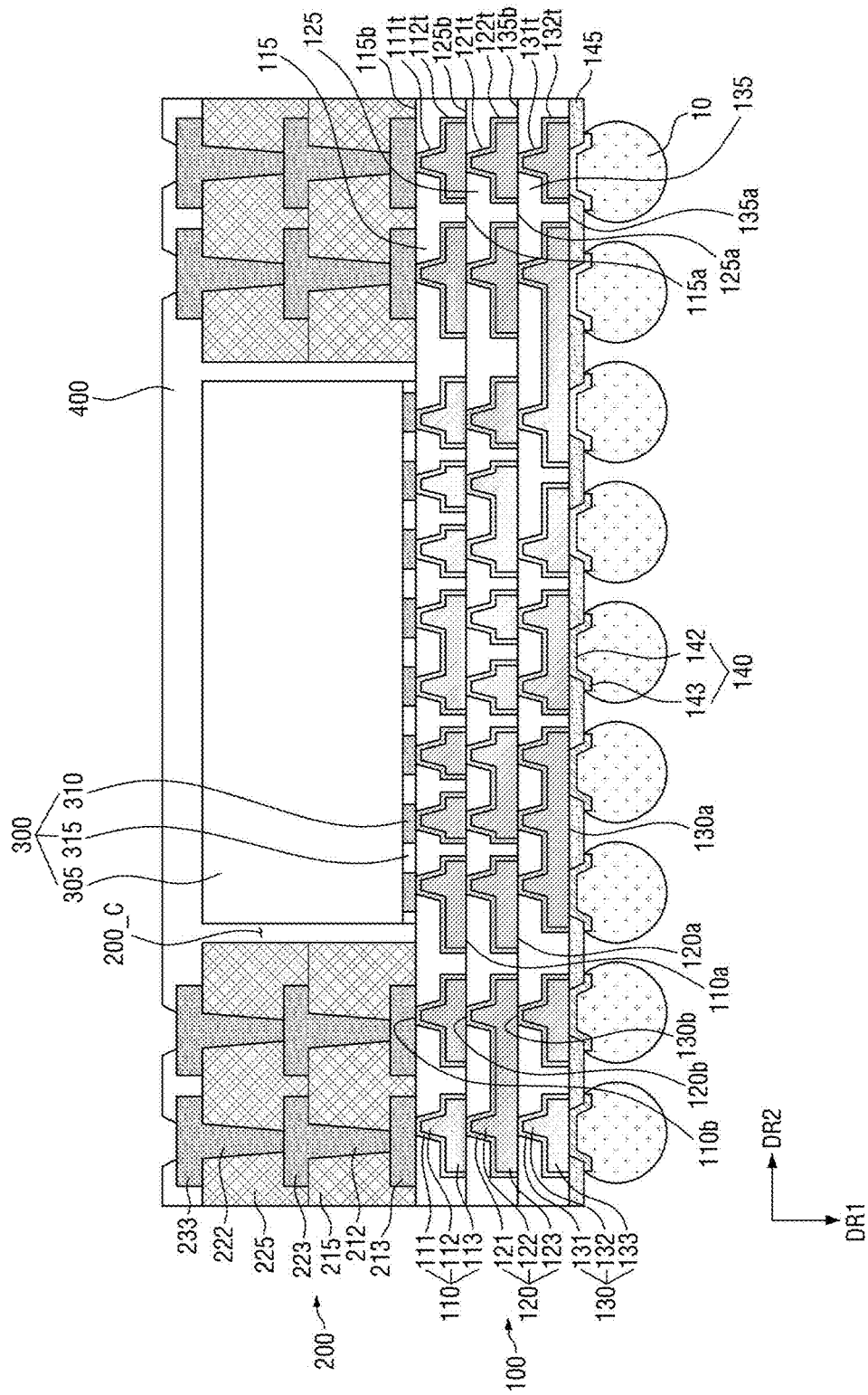
FIG. 1 is a diagram for explaining a semiconductor package according to example embodiments.

FIG. 1 is a diagram for explaining a semiconductor package according to example embodiments.

Referring to FIG. 1, a semiconductor package according to some embodiments of the present disclosure may include a redistribution structure 100, an under bump metal layer 140, a first passivation layer 145, a core layer 200, a first semiconductor chip 300 and a first molding layer 400.

The redistribution structure 100 may include a plurality of redistribution patterns 110, 120 and 130 and a plurality of insulating layers 115, 125 and 135. The redistribution structure 100 may include, for example, a first redistribution pattern 110, a first insulating layer 115, a second redistribution pattern 120, a second insulating layer 125, a third redistribution pattern 130 and a third insulating layer 135. Although the redistribution structure 100 is shown as including only three insulating layers 115, 125 and 135 and three redistribution patterns 110, 120 and 130 in this drawing, this is an example, and the number, location or arrangement of the insulating layers 115, 125 and 135 and the redistribution patterns 110, 120 and 130 may be various.

The first to third insulating layers 115, 125 and 135 may be a single layer. The first to third insulating layers 115, 125 and 135 may include a first faces 115a, 125a and 135a and a second faces 115b, 125b and 135b opposite to each other. For example, the first faces 115a, 125a and 135a and the second faces 115b, 125b and 135b may be opposite to each other in a first direction DR1. The first faces 115a, 125a and 135a may be upper faces on the basis of the first direction DR1, and the second faces 115b, 125b and 135b may be lower faces on the basis of the first direction DR1. Here, the first direction DR1 may be a thickness direction of the first to third insulating layers 115, 125 and 135.

The first to third insulating layers 115, 125 and 135 may be sequentially stacked in the first direction DR1. The second insulating layer 125 may be placed on the first face 115a of the first insulating layer 115, and the third insulating layer 135 may be placed on the first face 125a of the second insulating layer 125.

The first face 115a of the first insulating layer 115 may be the second face 125b of the second insulating layer 125, and the first face 125a of the second insulating layer 125 may be the second face 135b of the third insulating layer 135.

The first to third insulating layers 115, 125 and 135 may include the same material as each other. For example, the first to third insulating layers 115, 125 and 135 may include a photo imagable dielectric (PID), such as a polyimide or epoxy. The PID (e.g., polyimide or epoxy) may include photoinitiators.

The first to third insulating layers 115, 125 and 135 may include first to third via trenches 112t, 122t and 132t, and first to third wiring trenches 113t, 123t and 133t, respectively.

The first to third via trenches 112t, 122t and 132t may expose at least some of the second faces 115b, 125b and 135b of the first to third insulating layers 115, 125 and 135, respectively. The bottom faces of the first to third via trenches 112t, 122t and 132t may be placed on the same plane as the second faces 115b, 125b and 135b of the first to third insulating layers 115, 125 and 135, respectively.

The widths of the first to third via trenches 112t, 122t and 132t may gradually decrease in the direction from the first face 115a of the first insulating layer 115 to the second face 115b of the first insulating layer 115. That is, the widths of the first to third via trenches 112t, 122t and 132t may gradually increase in the first direction DR1. Here, the width of the first to third via trenches 112t, 122t and 132t may be based on a second direction DR2, and the second direction DR2 may be a length direction of the first to third insulating layers 115, 125 and 135.

The first to third wiring trenches 113t, 123t and 133t may be placed on the first to third via trenches 112t, 122t and 132t, respectively. The first to third wiring trenches 113t, 123t and 133t may be connected to the first to third via trenches 112t, 122t and 132t, respectively. The bottom faces of the first to third wiring trenches 113t, 123t and 133t may be connected to the side walls of the first to third via trenches 112t, 122t and 132t, respectively.

The side walls of the first to third wiring trenches 113t, 123t and 133t may have steps with the side walls of the first to third via trenches 112t, 122t and 132t, respectively. That is, the side walls of the first to third wiring trenches 113t, 123t and 133t may not be placed on the same line as the side walls of the first to third via trenches 112t, 122t and 132t.

The first to third redistribution patterns 110, 120 and 130 may be placed in the first to third insulating layers 115, 125 and 135, respectively. The upper faces 110a, 120a and 130a of the first to third redistribution patterns 110, 120 and 130 may be placed on the same plane as the first faces 115a, 125a and 135a of the first to third insulating layers 115, 125 and 135, respectively. Lowermost faces 110b, 120b and 130b of the first to third redistribution patterns 110, 120 and 130 may be placed on the same plane as the second faces 115b, 125b and 135b of the first to third insulating layers 115, 125 and 135, respectively. Each of the first to third insulating layers 115, 125 and 135 may wrap the side faces of the first to third redistribution patterns 110, 120 and 130.

The first to third redistribution patterns 110, 120 and 130 may include first to third seed layers 111, 121 and 131, first to third via regions 112, 122 and 132, and first to third wiring regions 113, 123 and 133.

The first to third seed layers 111, 121 and 131 may conformally extend along profiles of the first to third via trenches 112t, 122t and 132t and the first to third wiring trenches 113t, 123t and 133t, respectively. The first to third seed layers 111, 121 and 131 may extend along the side walls and bottom faces of the first to third via trenches 112t, 122t and 132t and the side walls and bottom faces of the first to third wiring trenches 113t, 123t and 133t. The first to third seed layers 111, 121 and 131 placed on the bottom faces of the first to third via trenches 112t, 122t and 132t may be placed on the same plane as the second faces 115b, 125b and 135b of the first to third insulating layers 115, 125 and 135, respectively.

The first to third via regions 112, 122 and 132 may be placed in the first to third via trenches 112t, 122t and 132t, respectively. The first to third via regions 112, 122 and 132 may be placed on the first to third seed layers 111, 121 and 131 placed in the first to third via trenches 112t, 122t and 132t, respectively. The first to third via regions 112, 122 and 132 may fill the first to third via trenches 112t, 122t and 132t, respectively.

The first to third wiring regions 113, 123 and 133 may be placed in the first to third wiring trenches 113t, 123t and 133t, respectively. The first to third wiring regions 113, 123 and 133 may be placed on the first to third seed layers 111, 121 and 131 placed in the first to third wiring trenches 113t, 123t and 133t, respectively. The first to third wiring regions 113, 123 and 133 may fill the first to third wiring trenches 113t, 123t and 133t, respectively. The upper faces of the first to third wiring regions 113, 123 and 133 may be placed on the same plane as the first faces 115a, 125a and 135a of the first to third insulating layers 115, 125 and 135, respectively.

The first wiring region 113 may be connected to the second wiring region 123 through the second via region 122. The second wiring region 123 may be connected to the third wiring region 133 through the third via region 132.

The first to third redistribution patterns 110, 120 and 130 may include a conductive material. The first to third redistribution patterns 110, 120 and 130 may include, for example, copper (Cu). The present disclosure is not limited thereto, and the first to third redistribution patterns 110, 120 and 130 may include, but is not limited to, at least one of aluminum (Al), silver (Ag), tin (Sn), gold (Au), nickel (Ni), lead (Pb), titanium (Ti), and alloys thereof.

The first to third redistribution patterns 110, 120 and 130 may perform various functions, depending on the design of the layer. For example, the first to third redistribution patterns 110, 120 and 130 may include a ground pattern, a power pattern, a signal pattern and the like. The signal pattern may input and output, for example, various electric signals other than the ground signal and the power signal, for example, data electric signals and the like.

The first passivation layer 145 may be placed on the first face 135a of the third insulating layer 135. The first passivation layer 145 may expose at least a part of the upper face 130a of the third redistribution pattern 130. The first passivation layer 145 may include, for example, an insulating material.

The under bump metal layer 140 may be placed on the upper face 130a of the third redistribution pattern 130 exposed by the first passivation layer 145. The under bump metal layer 140 may include a UBM via 142 and a UBM pad 143. The under bump metal layer 140 shown in this drawing is only an example, and the number, position, or arrangement of the under bump metal layers 140 may be various.

The UBM via 142 may be placed on the upper face 130a of the third redistribution pattern 130. The UBM via 142 may be placed in the first passivation layer 145.

The UBM pad 143 may be placed on the UBM via 142. The UBM pad 143 may be connected to the third redistribution pattern 130 through the UBM via 142. This enables the under bump metal layer 140 to be electrically connected to the redistribution structure 100.

The UBM pad 143 may penetrate the first passivation layer 145 from the respective ends of the UBM via 142 and extend to the upper face of the first passivation layer 145. At least a part of the UBM pad 143 may enter the first passivation layer 145.

The under bump metal layer 140 may include, for example, a conductive material.

The first solder balls 150 may be placed on the under bump metal layer 140. The first solder balls 150 may be in contact with the under bump metal layer 140. The first solder ball 150 may include, for example, but is not limited to, at least one of lead (Pb), tin (Sn), indium (In), bismuth (Bi), antimony (Sb), silver (Ag), and alloys thereof.

A core layer 200 may be placed on the second face 115b of the first insulating layer 115. The core layer 200 may include a cavity 200_C, a plurality of core insulating layers 215 and 225, a plurality of core wiring layers 213, 223 and 233, and a plurality of core vias 212 and 222. The core layer 200 may include, for example, a cavity 200_C, first and second core insulating layers 215 and 225, first to third core wiring layers 213, 223 and 233, and first and second core vias 212 and 222. Although the core layer 200 is shown as having one cavity 200_C, two core insulating layers 215 and 225, three core wiring layers 213, 223 and 233, and two core vias 212 and 222 in this drawing, this is only an example, and the number, position or arrangement of the cavity 200_C, the core insulating layers 215 and 225, the core wiring layers 213, 223 and 233, and the core vias 212 and 222 may be various.

The cavity 200_C may penetrate the core layer 200 in the first direction DR1. The cavity 200_C may be placed, for example, at the center of the core layer 200.

The first core insulating layer 215 may be placed on the second face 115b of the first insulating layer 115, and the second core insulating layer 225 may be placed on the first core insulating layer 215.

The first and second core insulating layers 215 and 225 may include, for example, an insulating material, such as a thermosetting resin such as an epoxy resin or a thermoplastic resin such as polyimide, and may further include an inorganic filler. Or, the first and second core insulating layers 215 and 225 may include a resin impregnated in a core material such as a glass fiber (a glass cloth, and a glass fabric) together with the inorganic filler, for example, prepreg, ABF (Ajinomoto Build-up Film) or FR-4, and BT (Bismaleimide Triazine).

The first and second core wiring layers 213 and 223 may be placed in the first and second core insulating layers 215 and 225, respectively. The third core wiring layer 233 may be placed on the second core insulating layer 225. The third core wiring layer 233 may be placed in the first molding layer 400.

In this drawing, although the upper face of the first core wiring layer 213 and the upper face of the first core insulating layer 215 are shown as being placed on the same plane, this is only an example. The upper face of the first core wiring layer 213 may have a step with the upper face of the first core insulating layer 215. For example, the first core wiring layer 213 may enter the inside of the first core insulating layer 215 to prevent it from being contaminated by the first molding layer 400.

The first and second core vias 212 and 222 may be placed in the first and second core insulating layers 215 and 225, respectively. The first and second core vias 212 and 222 may penetrate the first and second core insulating layers 215 and 225 to connect the first to third core wiring layers 213, 223 and 233 to each other. For example, the first core via 212 may penetrate the first core insulating layer 215 to connect the first core wiring layer 213 and the second core wiring layer 223, and the core via 222 may penetrate the second core insulating layer 225 to connect the second core wiring layer 223 and the third core wiring layer 233.

The first to third core wiring layers 213, 223 and 233 and the first and second core vias 212 and 222 may include a conductive material. Therefore, an electrical route that connects the upper and lower faces may be formed in the core layer 200. The first to third core wiring layers 213, 223 and 233, and the first and second core vias 212 and 222 may include, for example, but is not limited to, at least one of copper (Cu), aluminum (Al), silver (Ag), tin (Sn), gold (Au), nickel (Ni), lead (Pb), titanium (Ti), and alloys thereof.

The first semiconductor chip 300 may be placed on the second face 115b of the first insulating layer 115. The first semiconductor chip 300 may be placed in the cavity 200_C of the core layer 200. The side faces of the first semiconductor chip 300 may be surrounded by the core layer 200.

The first semiconductor chip 300 may be an integrated circuit (IC) in which hundreds to millions or more semiconductor elements are integrated in a single chip. For example, the first semiconductor chip 300 may be, but is not limited to, an application processor (AP), such as a CPU (Central Processing Unit), a GPU (Graphic Processing Unit), a FPGA (Field-Programmable Gate Array), a digital signal processor, an encryption processor, a microprocessor, and a microcontroller. For example, the first semiconductor chip 300 may be a logic chip such as an ADC (Analog-Digital Converter) or an ASIC (Application-Specific IC), and may be a memory chip such as a volatile memory (e.g., a DRAM) or a non-volatile memory (e.g., a ROM or a flash memory). Also, the first semiconductor chip 300 may, of course, be configured by combination of these elements.

The first semiconductor chip 300 may include, for example, a body 305, a first chip pad 310 and a passivation film 315.

Various semiconductor elements may be formed in the body 305. The body 305 may include, for example, bulk silicon or an SOI (silicon-on-insulator). The body 305 may be a silicon substrate or may include, but is not limited to, other materials, for example, silicon germanium, an SGOI (silicon germanium on insulator), indium antimonide, lead tellurium compound, indium arsenide, indium phosphide, gallium arsenide or gallium antimonide.

The first chip pad 310 may be formed on the surface of the body 305. The chip pad 310 may be electrically connected to an electric circuit formed in the body 305, for example, a circuit pattern or the like. The first chip pad 310 may include, for example, but is not limited to, aluminum (Al).

The first chip pad 310 may be connected to the first wiring region 113 of the redistribution structure 100 through the first via region 112. Therefore, the first semiconductor chip 300 may be electrically connected to the redistribution structure 100.

The passivation film 315 may be formed on the surface of the body 305. Also, the passivation film 315 may expose at least a part of the first chip pad 310. For example, the passivation film 315 may be formed to cover a part of the first chip pad 310. The passivation film 315 may include, for example, but is not limited to, an oxide film or a nitride film.

The first molding layer 400 may be placed on the second face 115b of the first insulating layer 115. The first molding layer 400 may cover at least a part of the first semiconductor chip 300 and the core layer 200. For example, the first molding layer 400 may fill the cavity 200_C, and may extend along the upper faces of the first semiconductor chip 300 and the core layer 200. Also, the side faces of the first molding layer 400 may be continuous with the side faces of the core layer 200.

The first molding layer 400 may include an insulating material. The first molding layer 400 may include, for example, a thermosetting resin such as an epoxy resin, a thermoplastic resin such as polyimide, or resin (for example, prepreg, an ABF (Ajinomoto Build-up Film), a FR-4, and a BT (Bismaleimide Triazine)) in which these resins are mixed with an inorganic filler or impregnated in the core material such as a glass fiber (a glass cloth and a glass fabric) together with the inorganic filler, or may include a photo imagable dielectric (PID).

Figure 2:
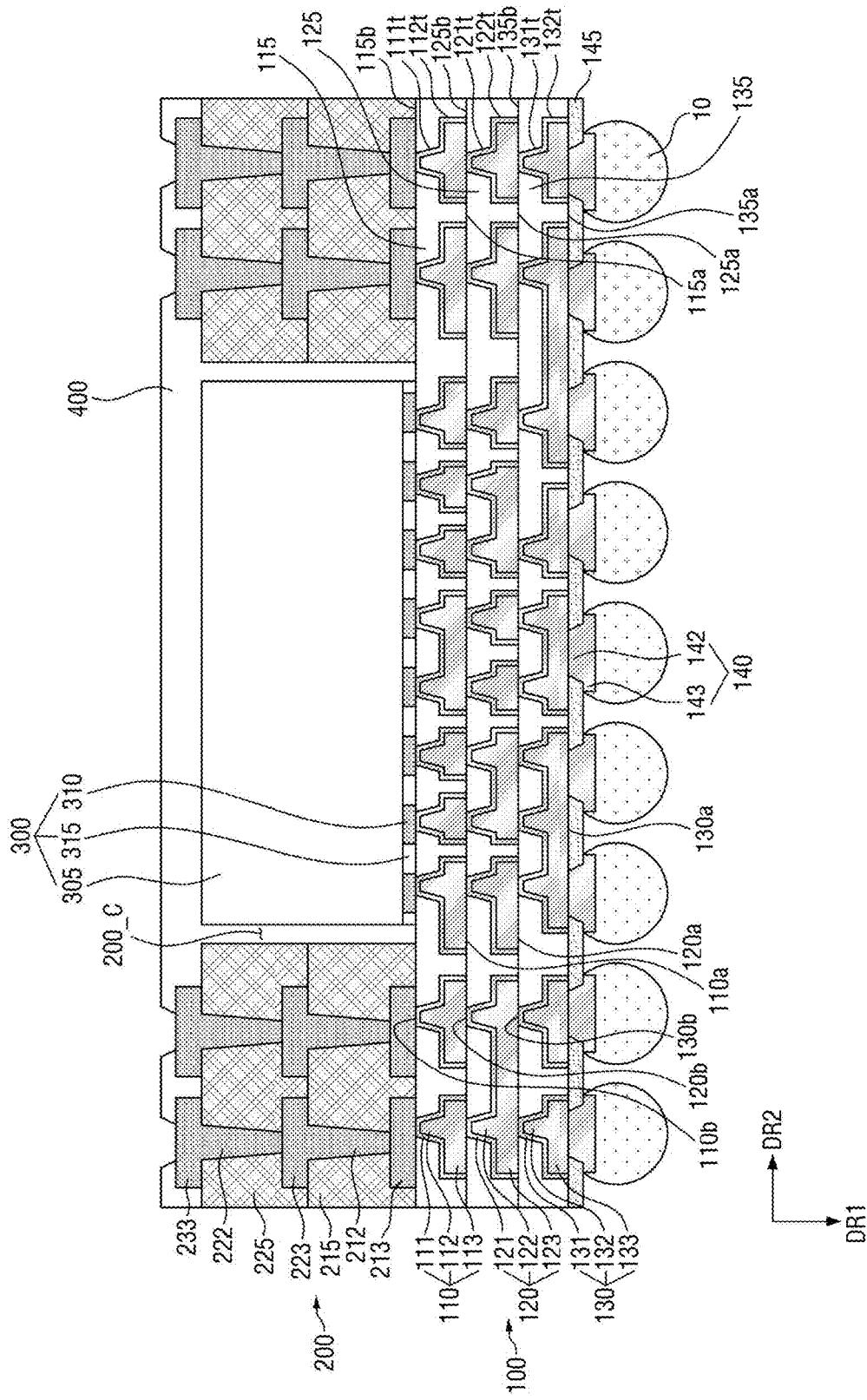
FIG. 2 is a diagram for explaining the semiconductor package according to example embodiments.

FIG. 2 is a diagram for explaining a semiconductor package according to example embodiments.

Referring to FIG. 2, in the semiconductor package according to some other embodiments of the present disclosure, the UBM pad 143 may be placed on the first passivation layer 145. The UBM pad 143 may extend along the upper face of the first passivation layer 145. That is, the UBM pad 143 may protrude from the first passivation layer 145 in the first direction DR1.

The UBM via 142 may penetrate the first passivation layer 145. The UBM via 142 may penetrate the first passivation layer 145 to connect the UBM pad 143 and the redistribution structure 100.

Figure 3:
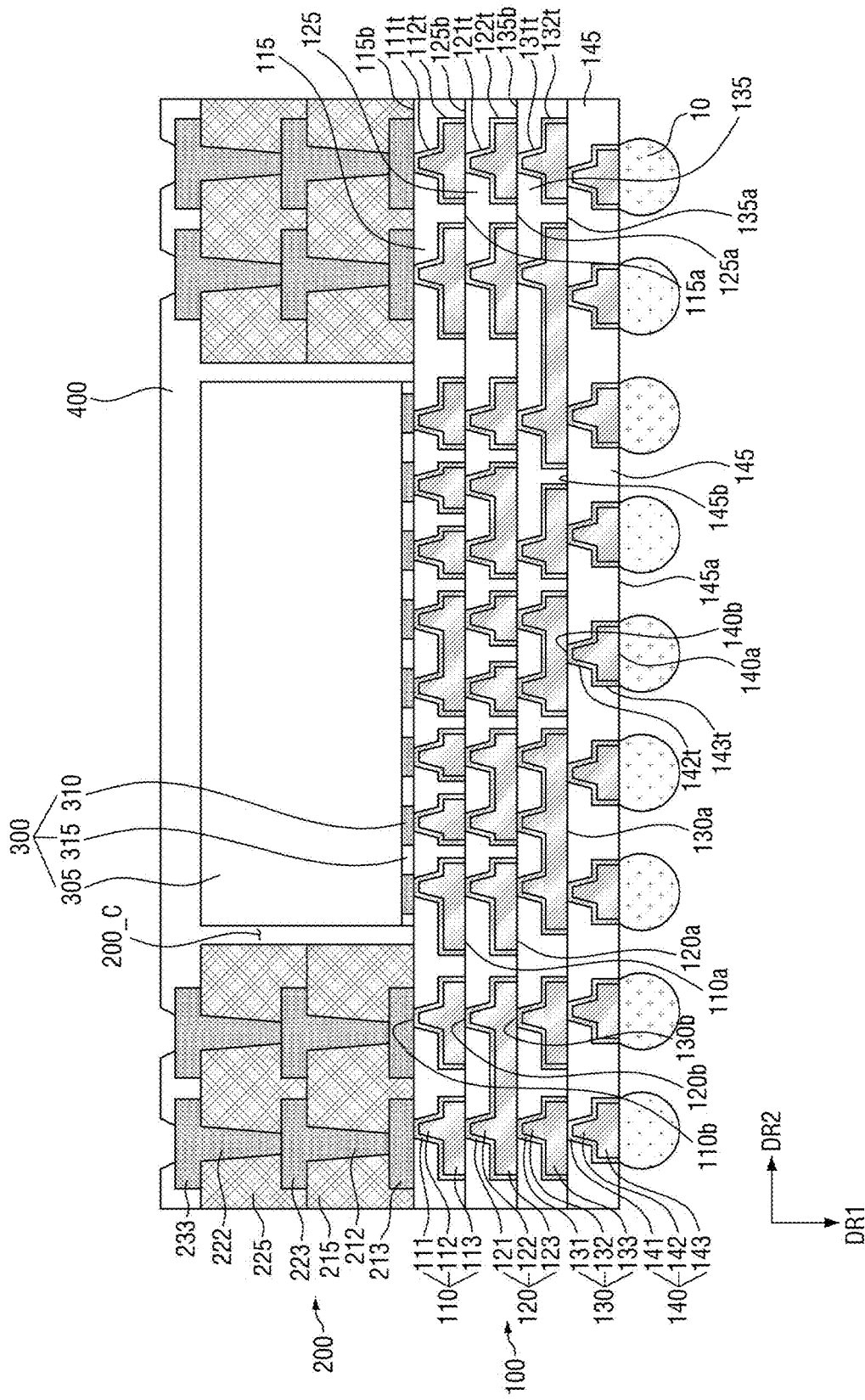
FIG. 3 is a diagram for explaining the semiconductor package according to example embodiments.

FIG. 3 is a diagram for explaining a semiconductor package according to example embodiments.

Referring to FIG. 3, in the semiconductor package according to some other embodiments of the present disclosure, the first passivation layer 145 may be a single layer. The first passivation layer 145 may include a first face 145a and a second face 145b opposite to each other in the first direction DR1. The first face 145a may be an upper face on the basis of the first direction DR1, and the second face 145b may be a lower face on the basis of the first direction DR1.

The first passivation layer 145 may include, for example, the same material as the first to third insulating layers 115, 125 and 135. The first passivation layer 145 may include, for example, a photo imagable dielectric.

The first passivation layer 145 may further include a UBM via trench 142t and a UBM pad trench 143t.

The UBM via trench 142t may expose at least a part of the first face 135a of the third insulating layer 135. The UBM via trench 142t may expose at least a part of the third wiring region 133. A bottom face of the UBM via trench 142t may be placed on the same plane as the first face 135a of the third insulating layer 135. The width of the UBM via trench 142t may gradually increase in the first direction DR1.

The UBM pad trench 143t may be placed on the UBM via trench 142t. The UBM pad trench 143t may be connected to the UBM via trench 142t. The bottom face of the UBM pad trench 143t may be connected to the side wall of the UBM via trench 142t.

The side wall of the UBM pad trench 143t may have a step with the side wall of the UBM via trench 142t. That is, the side wall of the UBM pad trench 143t may not be placed on the same line as the side wall of the UBM via trench 142t.

The under bump metal layer 140 may be placed inside the first passivation layer 145. The upper face 140a of the under bump metal layer 140 may be placed on the same plane as the first face 145a of the first passivation layer 145. The lowermost face 140b of the under bump metal layer 140 may be placed on the same plane as the second face 145b of the first passivation layer 145. The first passivation layer 145 may wrap the side faces of the under bump metal layer 140.

The under bump metal layer 140 may further include a fourth seed layer 114. The fourth seed layer 114 may conformally extend along the profiles of the UBM via trench 142t and the UBM pad trench 143t. The fourth seed layer 114 may extend along the side wall and bottom face of the UBM via trench 142t, and the side wall and bottom face of the UBM pad trench 143t. The fourth seed layer 114 placed on the bottom face of the UBM via trench 142t may be placed on the same plane as the upper face 135a of the third insulating layer 135.

The UBM via 142 may be placed on the fourth seed layer 114 placed in the UBM via trench 142t. The UBM via 142 may fill the UBM via trench 142t.

The UBM pad 143 may be placed on the fourth seed layer 114 placed in the UBM pad trench 143t. The UBM pad 143 may fill the UBM pad trench 143t. The upper face 143a of the UBM pad 143 may be placed on the same plane as the first face 145a of the first passivation layer 145.

The under bump metal layer 140 may include, for example, the same material as the first to third redistribution patterns 110, 120 and 130. The under bump metal layer 140 may include, for example, copper.

Figure 4:
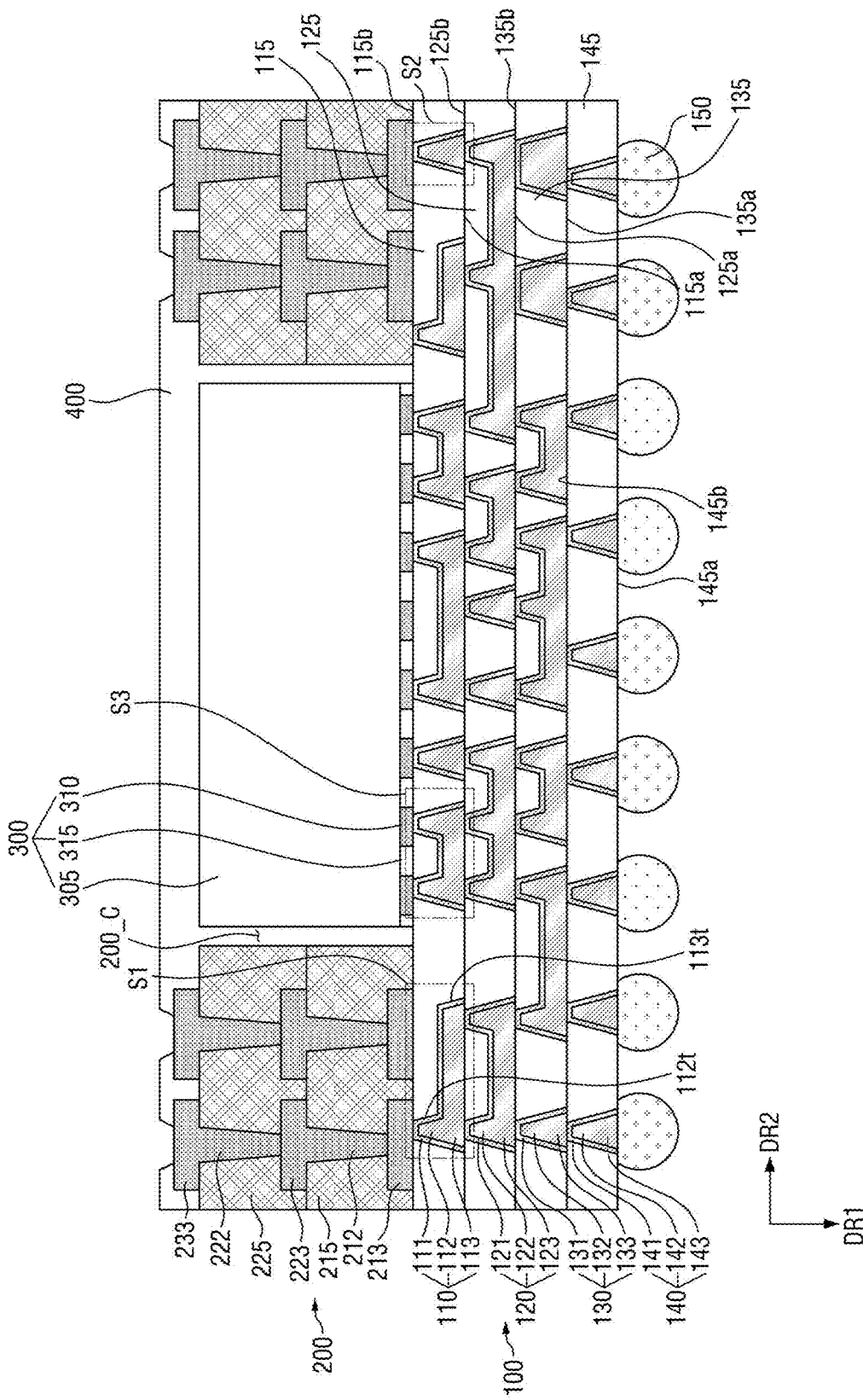
FIG. 4 is a diagram for explaining the semiconductor package according to example embodiments.
Figure 5:
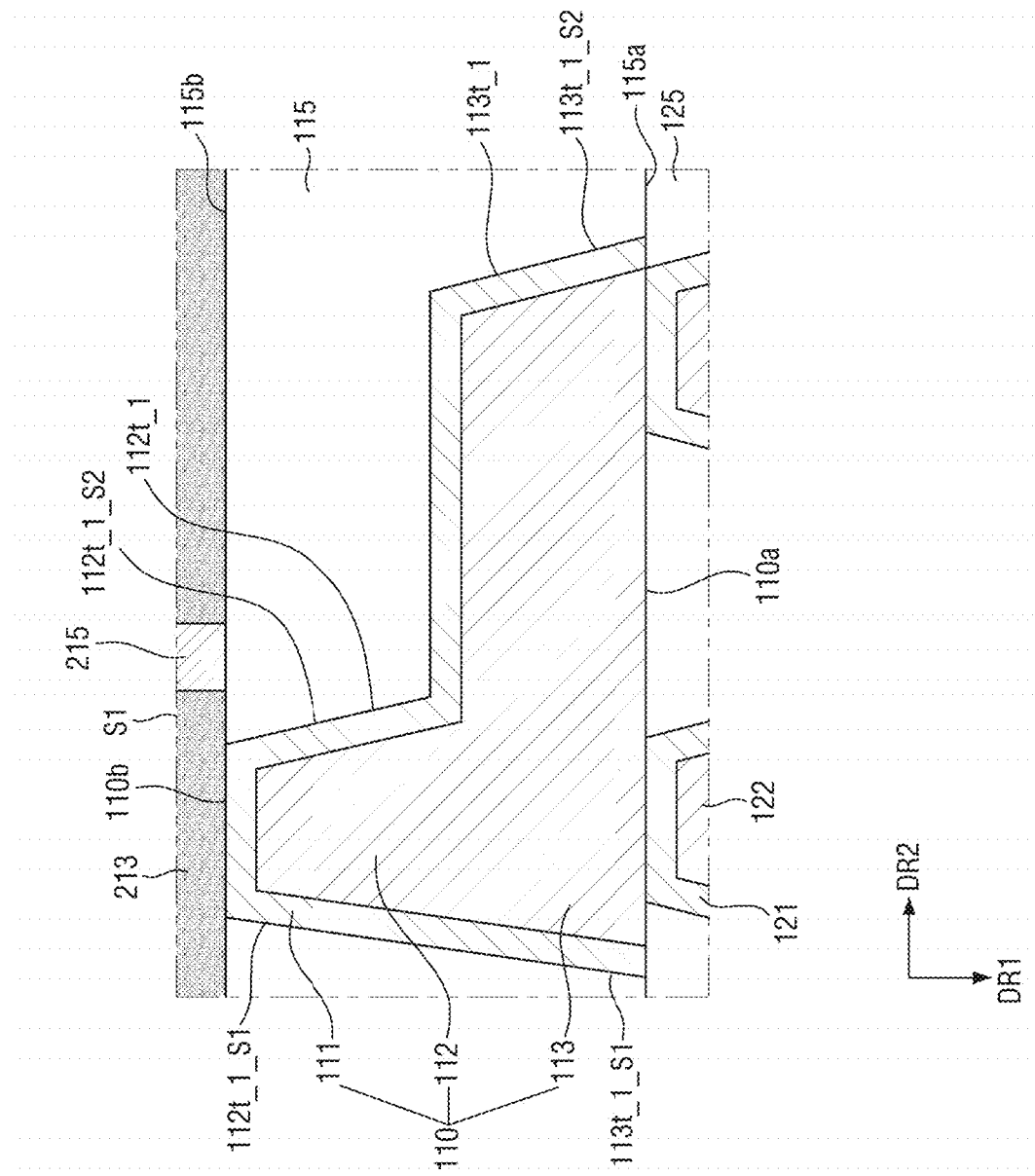
FIG. 5 is an enlarged view of a region S1 of FIG. 4.
Figure 6:
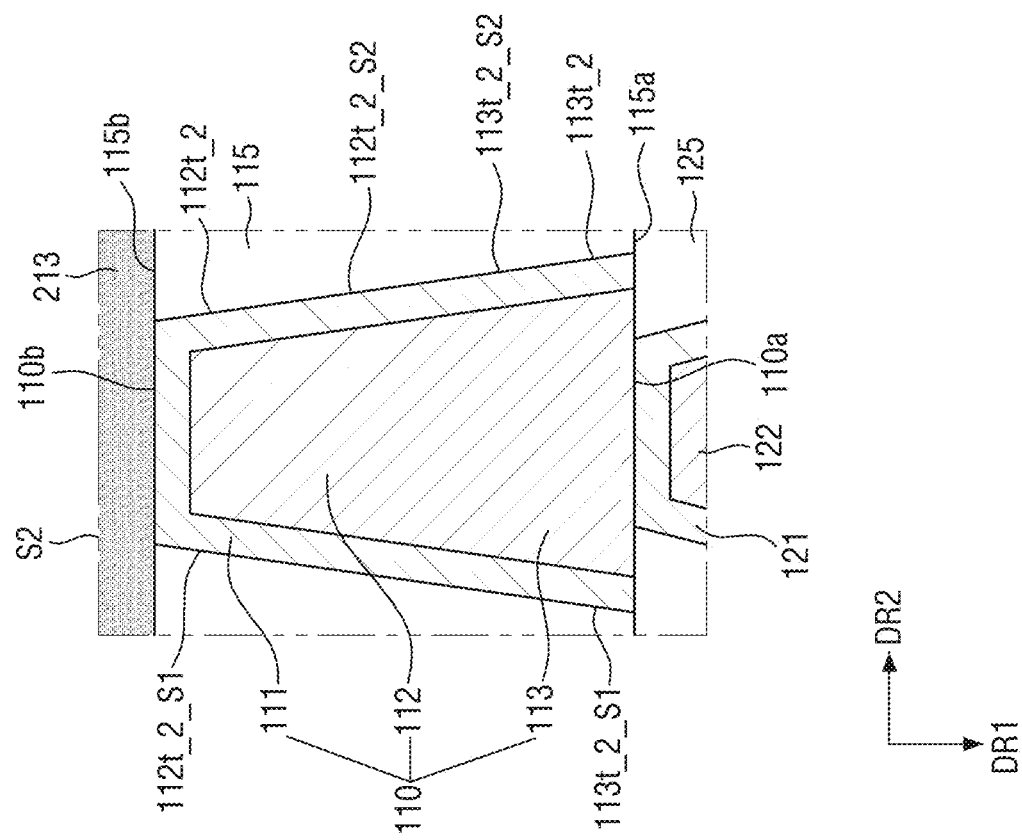
FIG. 6 is an enlarged view of a region S2 of FIG. 4.
Figure 7:
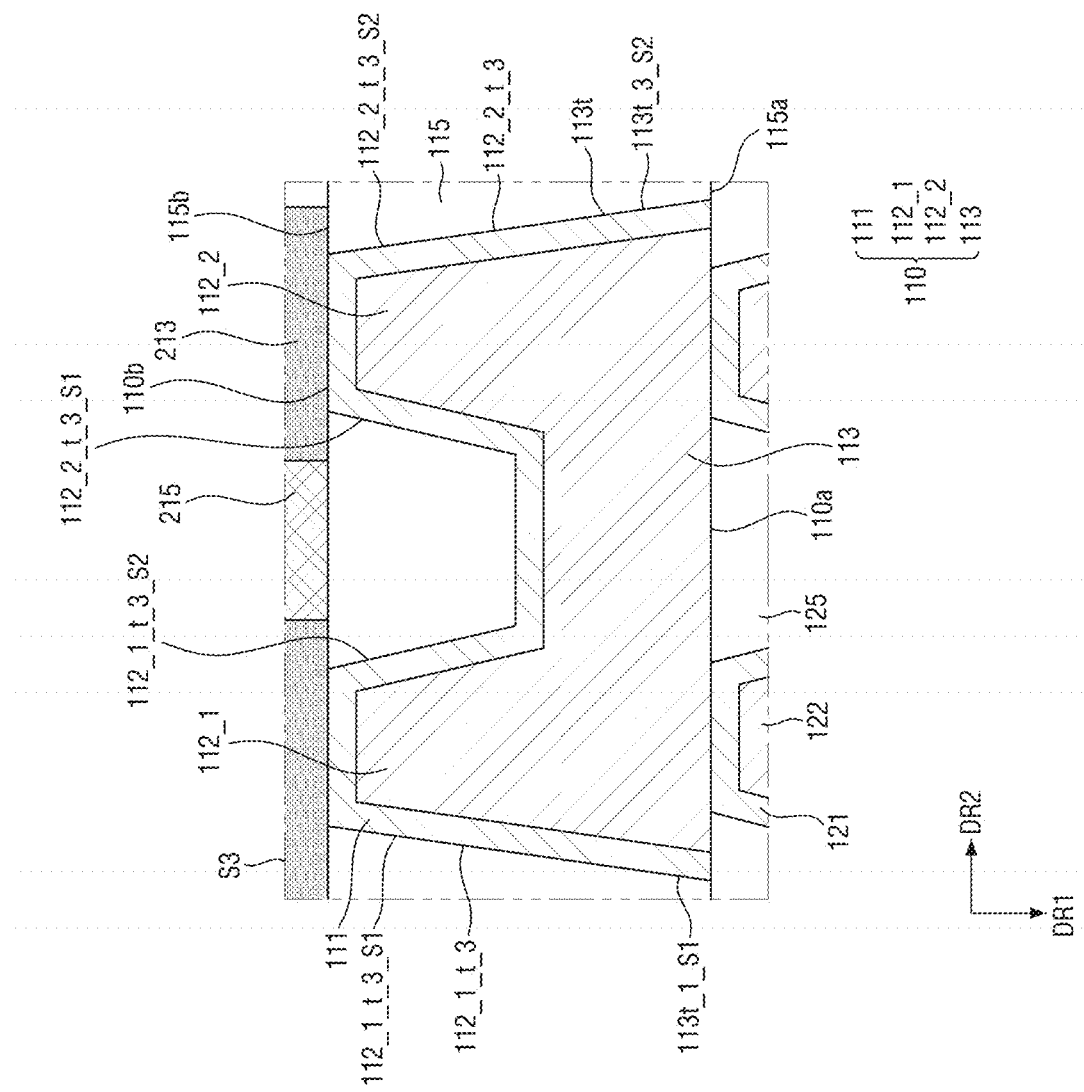
FIG. 7 is an enlarged view of a region S3 of FIG. 4.

FIG. 4 is a diagram for explaining a semiconductor package according to example embodiments. FIG. 5 is an enlarged view of the region S1 of FIG. 4, FIG. 6 is an enlarged view of the region S2 of FIG. 4, and FIG. 7 is an enlarged view of the region S3 of FIG. 4.

Referring to FIGS. 4 to 7, in the semiconductor package according to some other embodiments of the present disclosure, at least one of side walls of the first to third via trenches 112t, 122t and 132t may be placed on the same line as at least one of the side walls of the first to third wiring trenches 113t, 123t and 133t. At least one of the side walls of the UBM via trench 142t may be placed on the same line as at least one of the side walls of the UBM pad trench 143t.

For example, referring to FIG. 5, the first via trenches 112t_1, 112t_2 and 112t_3 may include first side walls 112t_1_S1, 112t_2_S1 and 112t_3_S1 and second side walls 112t_1_S2, 112t_2_S2 and 112t_3_S2 opposite to each other. For example, the first side walls 112t_1_S1, 112t_2_S1 and 112t_3_S1 and the second side walls 112t_1_S2, 112t_2_S2 and 112t_3_S2 may be opposite to each other in the second direction DR2.

The first wiring trenches 113t_1, 113t_2 and 113t_3 may include third side walls 113t_1_S1, 113t_2_S1 and 113t_3_S1, and fourth side walls 113t_1_S2, 113t_2_S2 and 113t_3_S2 opposite to each other. For example, the third side walls 113t_1_S1, 113t_2_S1 and 113t_3_S1 and the fourth side walls 113t_1_S2, 113t_2_S2 and 113t_3_S2 may be opposite to each other in the second direction DR2.

At least one of the first side walls 112t_1_S1, 112t_2_S1 and 112t_3_S1 and the second side walls 112t_1_S2, 112t_2_S2 and 112t_3_S2 of the first via trenches 112t_1, 112t_2 and 112t_3 may be directly connected to at least one of the third side walls 113t_1_S1, 113t_2_S1 and 113t_3_S1 and the fourth side walls 113t_1_S2, 113t_2_S2 and 113t_3_S2 of the first wiring trenches 113t_1, 113t_2 and 113t_3.

A first side wall 112t_1_S1 of the first via trench 112t_1 may be directly connected to a third side wall 113t_1_S1 of a first wiring trench 113t_1. The first side wall 112t_1_S1 of the first via trench 112t_1 may be placed on the same line as the third side wall 113t_1_S1 of the first wiring trench 113t_1. That is, the first side wall 112t_1_S1 of the first via trench 112t_1 and the third side wall 113t_1_S1 of the first wiring trench 113t_1 may not have a step.

A second side wall 112t_1_S2 of the first via trench 112t_1 may be connected to a fourth side wall 113t_1_S2 of the first wiring trench 113t_1 through a bottom face 113t_1_b of the first wiring trench 113t_1. Each of the second side wall 112t_1_S2 of the first via trench 112t_1 and the fourth side wall 113t_1_S2 of the first wiring trench 113t_1 may be directly connected to the bottom face 113t_1_b of the first wiring trench 113t_1. That is, the second side wall 112t_1_S2 of the first via trench 112t_1 and the fourth side wall 113t_1_S2 of the first wiring trench 113t_1 are not placed on the same line and may have a step.

Referring to FIG. 6, unlike FIG. 5, the second side wall 112t_2_S2 of the first via trench 112t_2 may also be directly connected to the fourth side wall 113t_2_S2 of the first wiring trench 113t_2.

The second side wall 112t_2_S2 of the first via trench 112t_2 may be placed on the same line as the fourth side wall 113t_2_S2 of the first wiring trench 113t_2. That is, the second side wall 112t_2_S2 of the first via trench 112t_2 and the fourth side wall 113t_2_S2 of the first wiring trench 113t_2 may not have a step.

Referring to FIG. 7, unlike FIG. 6, the first redistribution pattern 110 may include two first via regions 112_1 and 112_2.

A first-1 side wall 112_1_t_1_S1 of a first-1 via region 112_1 may be directly connected to a third side wall 113_t_1_S_1 of the first wiring trench 113t_1. A second-2 side wall 112_2_t_1_S2 of a first-2 via region 112_2 may be directly connected to a fourth side wall 113_t_1_S2 of the first wiring trench 113t_1.

A first-2 side wall 112_1_t_1_S2 of the first-1 via region 112_1 may be connected to a second-1 side wall 112_2_t_1_S1 of the first-2 via region 112_2 through the bottom face 113t_1_b of the first wiring trench 113t_1. Each of the first-2 side wall 112_1_t_1_S2 of the first-1 via region 112_1 and the second-1 side wall 112_2_t_1_S1 of the first-2 via region 112_2 may be directly connected to the bottom face 113t_1_b of the first wiring trench 113t_1. That is, the first-2 side wall 112_1_t_1_S2 of the first-1 via region 112_1 and the second-1 side wall 112_2_t_1_S1 of the first-2 via region 112_2 may not be placed on the same line.

FIGS. 8 to 14 are intermediate stage diagrams for explaining a method for fabricating a semiconductor package according to some embodiments of the present disclosure.

Figure 8:
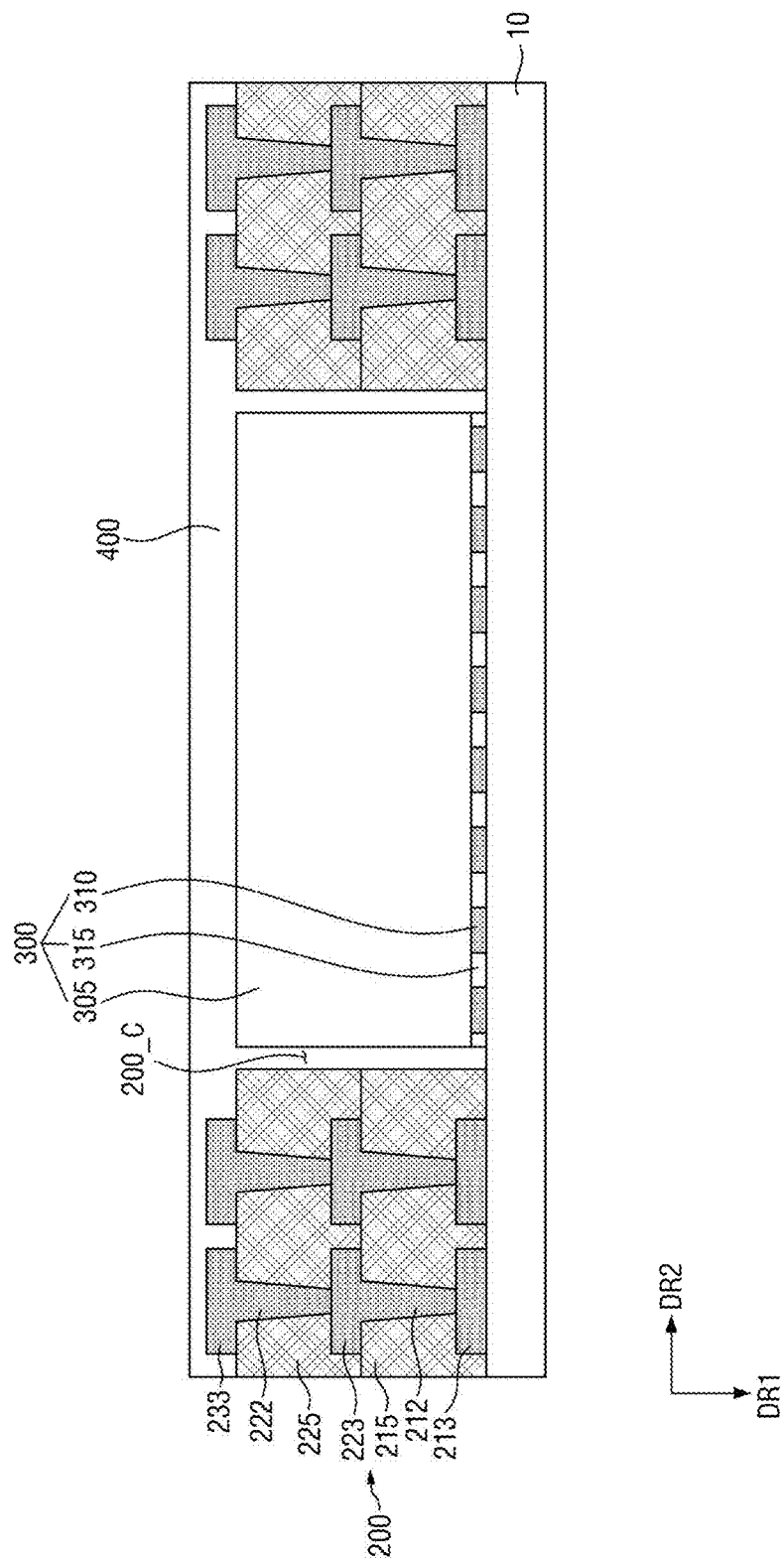
FIGS. 8 to 14 are intermediate stage diagrams for explaining a method for fabricating a semiconductor package according to example embodiments.

Referring to FIG. 8, a cavity 200_C penetrating upper and lower faces of the core layer 200 may be formed in the core layer 200. The core layer 200 may be attached onto a tape 10. An upper face of the core layer 200 in the first direction DR1 may be attached onto the tape 10.

A first semiconductor chip 300 may be placed in the cavity 200_C of the core layer 200. The first semiconductor chip 300 may be placed in a pace-down manner such that the first chip pad 310 and the passivation film 315 are attached to the tape 10.

A first molding layer 400 which covers the first semiconductor chip 300 and the core layer 200 may be formed on the tape 10. The first molding layer 400 may fill the space inside the cavity 200_C.

Figure 9:
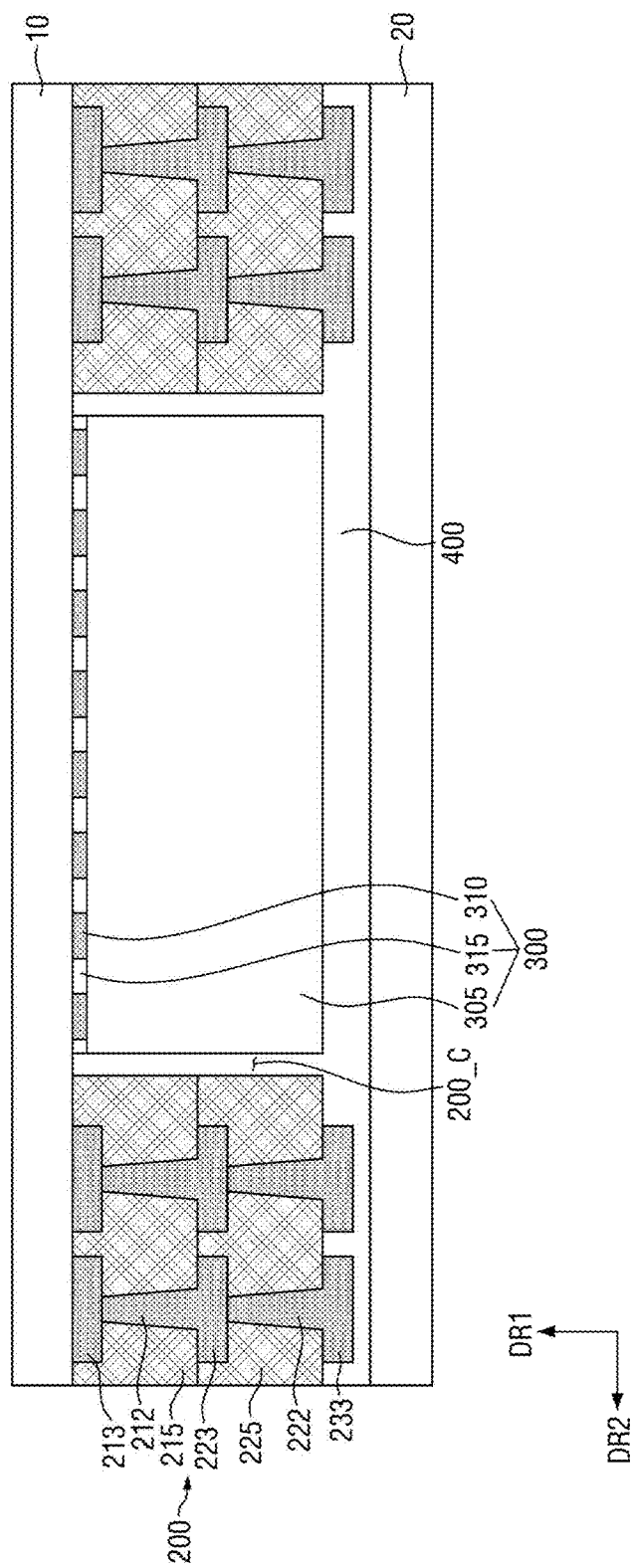

Referring to FIG. 9, a first molding layer 400 may be attached onto the support substrate 20. Subsequently, the semiconductor package may be turned upside down. The tape 10 may be removed.

The first insulating layer 115 may be formed on upper faces of the first core layer 200 and the first semiconductor chip 300 in the first direction DR1.

Figure 10:
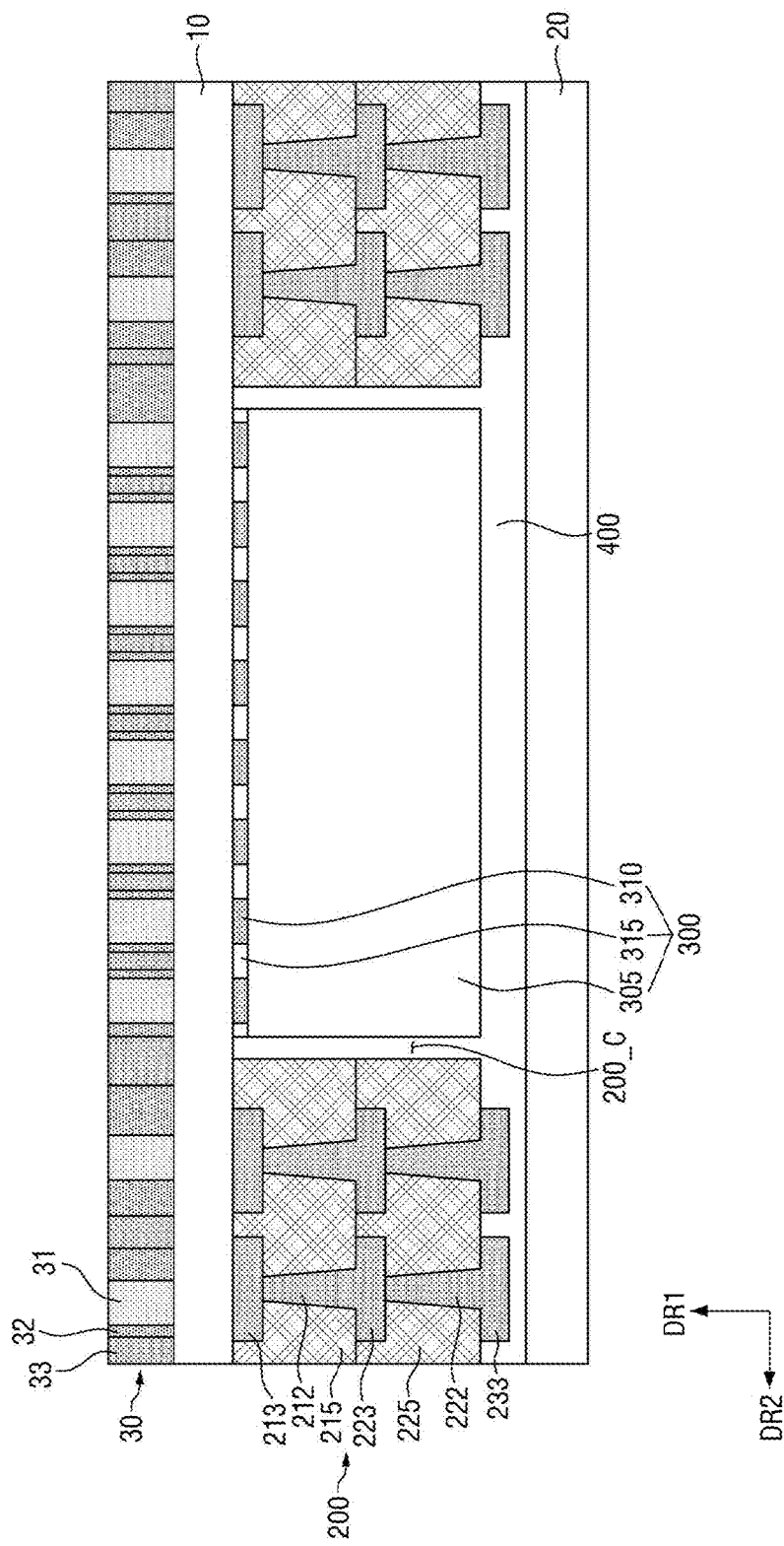

Referring to FIG. 10, a mask pattern 30 may be formed on the first insulating layer 115. The mask pattern 30 may include first to third portions 31, 32 and 33 having different transmissivities from each other.

The first portion 31 is a transparent region and may have a transmissivity of about 100%. The second portion 32 is a translucent region and may have a transmissivity greater than 0% and smaller than 100%. The second portion 32 may have, for example, a transmissivity of 50%. The transmissivity of the second portion 32 may be determined depending on the first redistribution pattern 110 to be designed. The third portion 33 is an opaque region through which no light transmits, and may have a transmissivity of about 0%.

The mask pattern 30 may be, for example, a halftone mask or a slit photomask.

Figure 11:
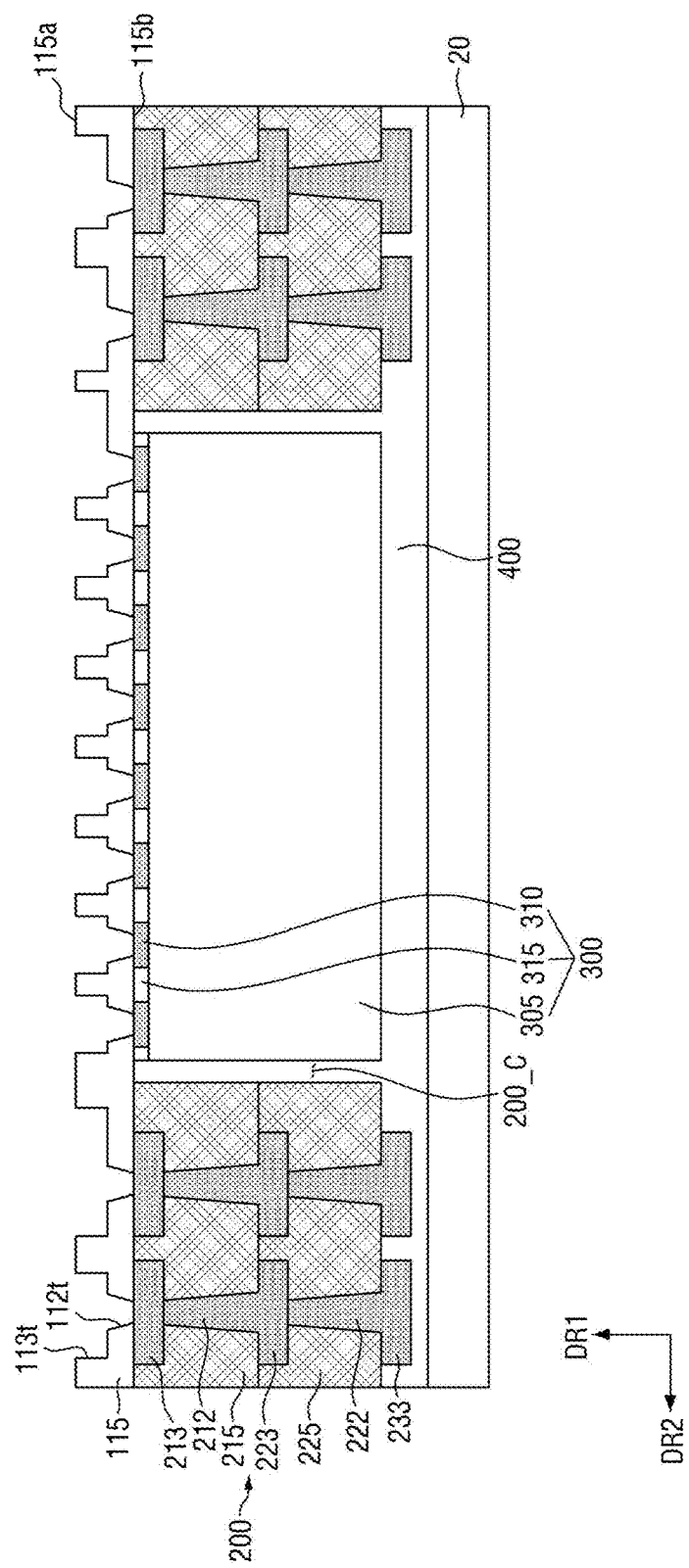

Referring to FIG. 11, the first insulating layer 115 may be patterned, using the mask pattern 30. A first via trench 112t and a first wiring trench 113t may be formed in the first insulating layer 115, by the mask pattern 30.

For example, the first via trench 112t may be formed in a portion patterned by the first portion 31, and the first wiring trench 113t may be formed in a portion patterned by the second portion 32. That is, the first via trench 112t and the first wiring trench 113t may be formed by a single process.

Subsequently, the mask pattern 30 may be removed.

Figure 12:
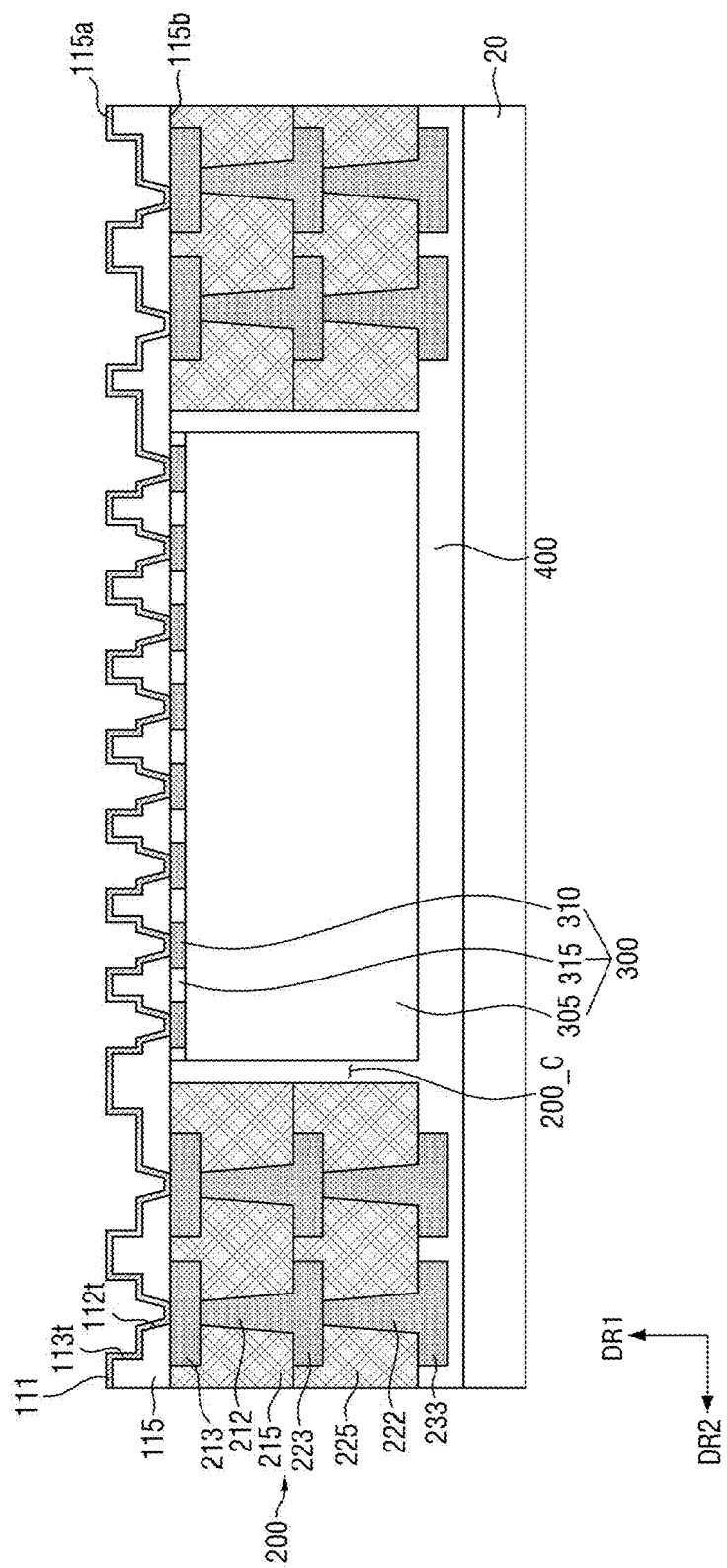

Referring to FIG. 12, a first seed layer 111 may be formed on the first insulating layer 115. The first seed layer 111 may be conformally formed along the first insulating layer 115. The first seed layer 11 may be conformally formed along the profiles of the first via trench 112t and the first wiring trench 113t.

The first seed layer 111 may include, for example, copper (Cu). The first seed layer 111 may be formed, but is not limited to, using methods such as a physical vapor deposition (PVD) method, a sputtering method or a chemical vapor deposition (CVD) method.

Figure 13:
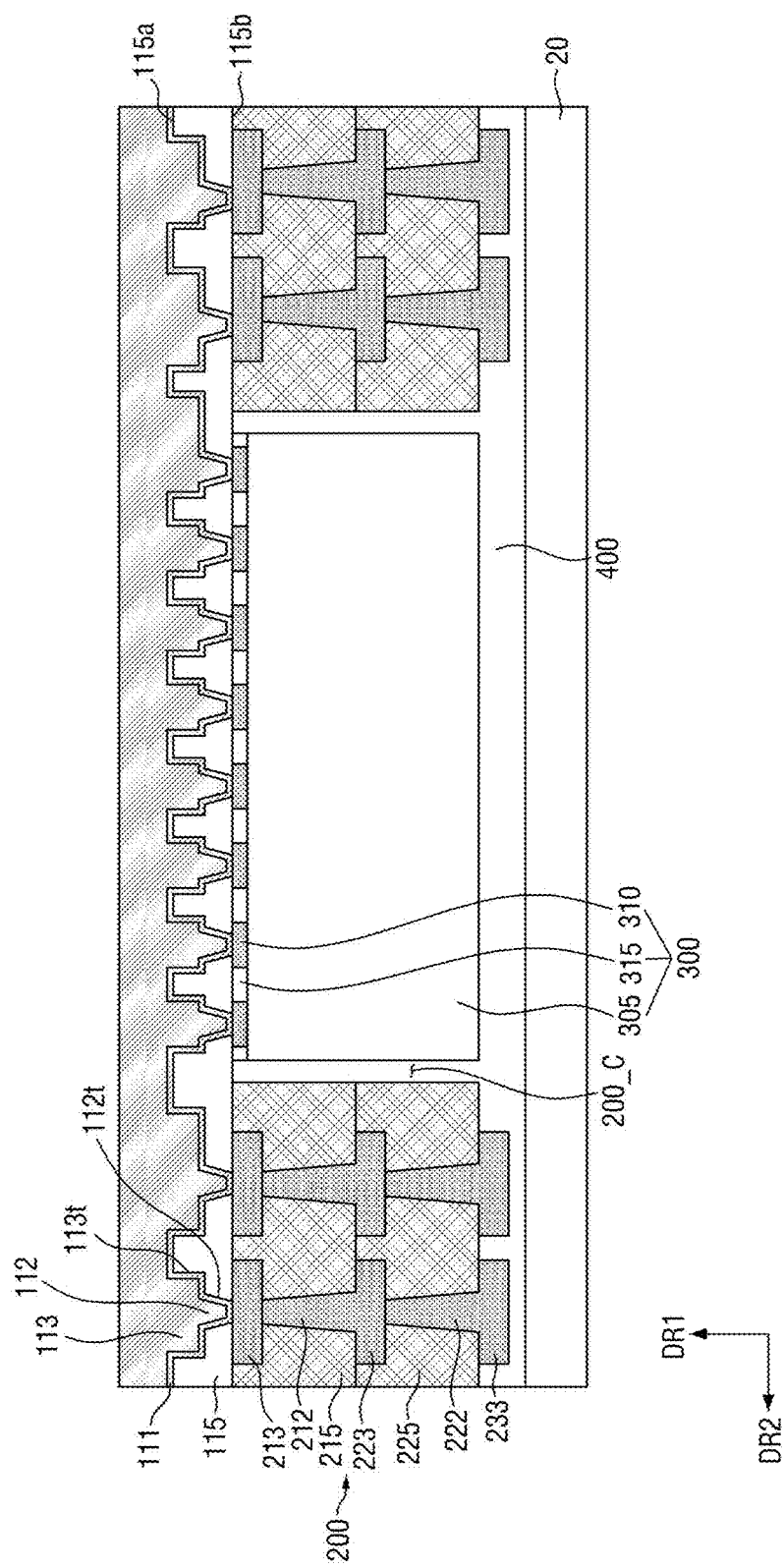

Referring to FIG. 13, a first via region 112 and a first wiring region 113 may be formed. The first via region 112 and the first wiring region 113 may be formed by, for example, an electroplating process, using the first seed layer 111 as an electrode.

That is, the first via region 112 and the first wiring region 113 may be formed by a single process in the semiconductor package according to some embodiments of the present disclosure. In addition, the first via region 112 and the first wiring region 113 may be formed through one exposure process using one mask pattern.

Figure 14:
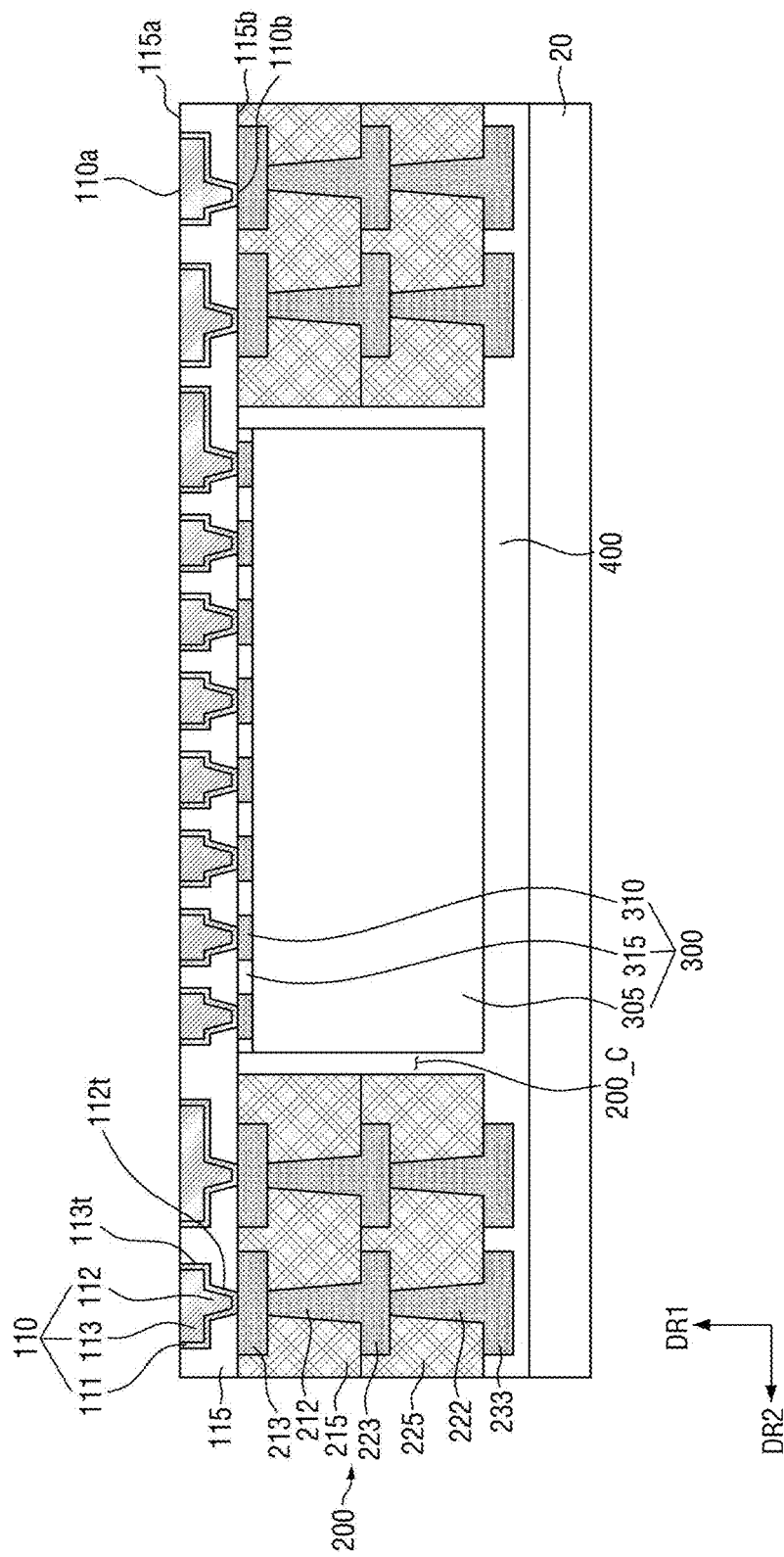

Referring to FIG. 14, a planarization process may be performed on the first redistribution pattern 110. A part of the first redistribution pattern 110 and the first insulating layer 115 may be etched by the planarization process to expose the first insulating layer 115. Therefore, the upper face 110a of the first redistribution pattern 110 and the first face 115a of the first insulating layer 115 may be placed on the same plane.

Next, referring to FIG. 3, second and third insulating layers 125 and 135, second and third redistribution patterns 120 and 130, a first passivation layer 145 and an under bump metal layer 140 may be formed. The second and third insulating layers 125 and 135, the second and third redistribution patterns 120 and 130, the first passivation layer 145, and the under bump metal layer 140 may be formed by the same process as that described above in FIGS. 9 to 14.

Figure 15:
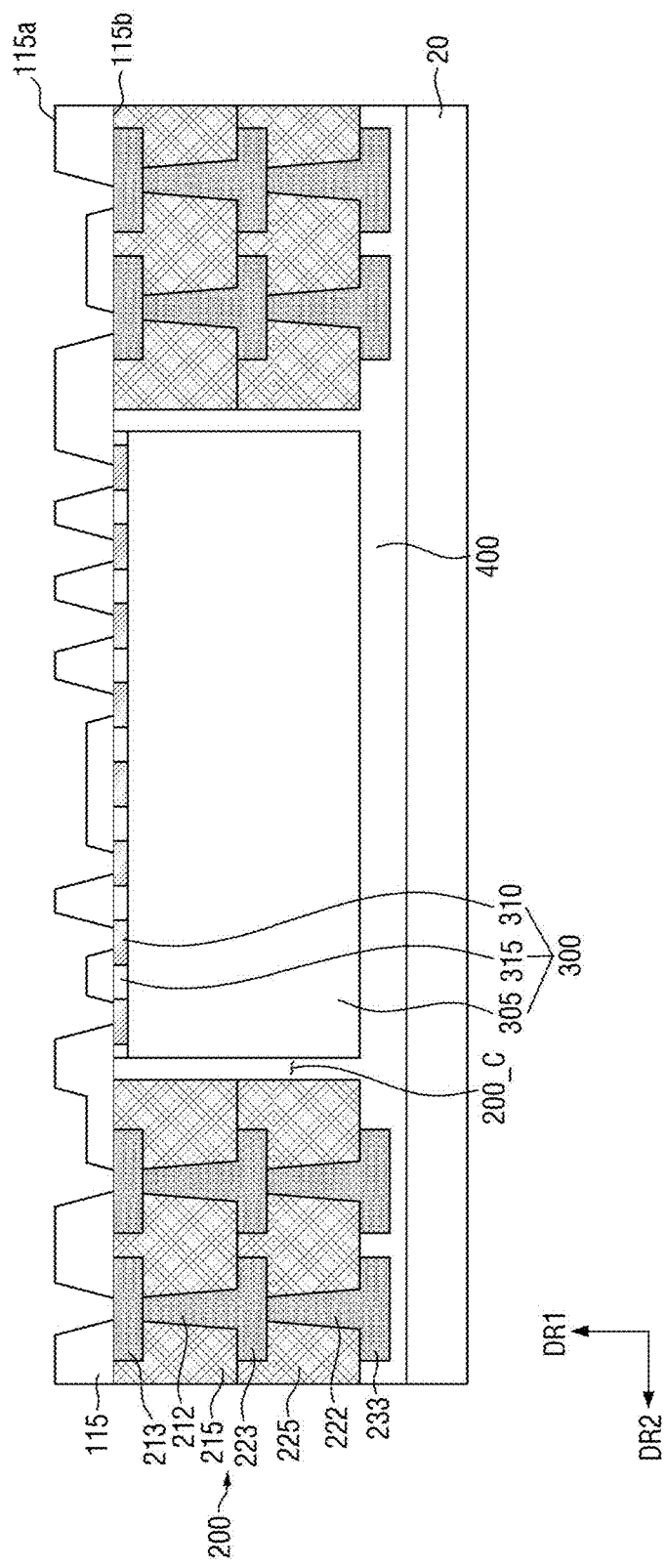
FIGS. 15 and 16 are intermediate stage diagrams for explaining the method for fabricating a semiconductor package according to example embodiments.
Figure 16:
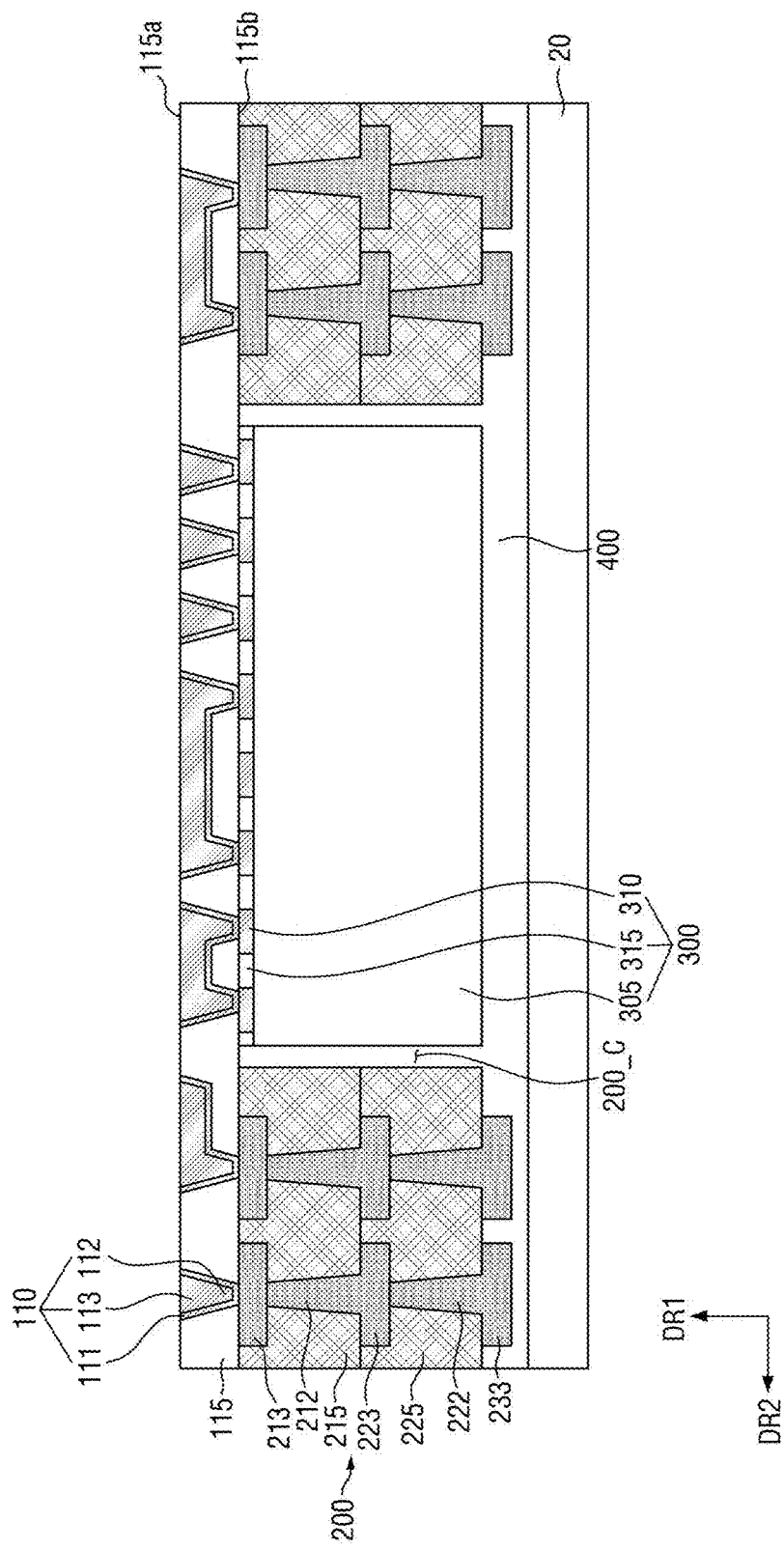

FIGS. 15 and 16 are intermediate stage diagrams for explaining a method for fabricating a semiconductor package according to example embodiments.

Referring to FIG. 15, in the method for fabricating a semiconductor package according to some other embodiments of the present disclosure, by sequentially performing the processes shown in FIGS. 8 to 10, the first insulating layer 115 may be patterned. A first via trench 112t and a first wiring trench 113t may be formed in the first insulating layer 115.

At least one of the side walls of the first via trench 112t may be placed on the same line as at least one of the side walls of the first wiring trench 113t.

Referring to FIG. 16, by sequentially performing the processes shown in FIGS. 12 and 14 subsequent to FIG. 15, the first redistribution pattern 110 may be formed. At least one of the side walls of the first via trench 112t may be placed on the same line as at least one of the side walls of the first wiring trench 113t.

When the first via region 112 and the first wiring region 113 are formed in different processes, the first via region 112 and the first wiring region 113 may be misaligned due to a distortion of panel, a process, or the like. As a result, the first wiring region 113 further includes an extra portion for being aligned with the first via region 112, and the first wiring region 113 has a width wider than that of the first via region 112. Therefore, the semiconductor package is spatially restricted by the extra portion of the first wiring region 113.

However, in the semiconductor package according to some other embodiments of the present disclosure, the first via region 112 and the first wiring region 113 may be simultaneously formed by a single process. Therefore, the first via region 112 and the first wiring region 113 may be automatically aligned positively. In addition, the first wiring region 113 does not need to include an extra portion for being aligned with the first via region 112. Therefore, the semiconductor package according to some embodiments of the present disclosure may be more free in spatial restrictions.

Next, referring to FIG. 4, second and third insulating layers 125 and 135, second and third redistribution patterns 120 and 130, the first passivation layer 145 and the under bump metal layer 140 may be formed. The second and third insulating layers 125 and 135, the second and third redistribution patterns 120 and 130, the first passivation layer 145 and the under bump metal layer 140 may be formed by the same process as that described in FIGS. 9 to 10 and FIGS. 15 to 16.

Figure 17:
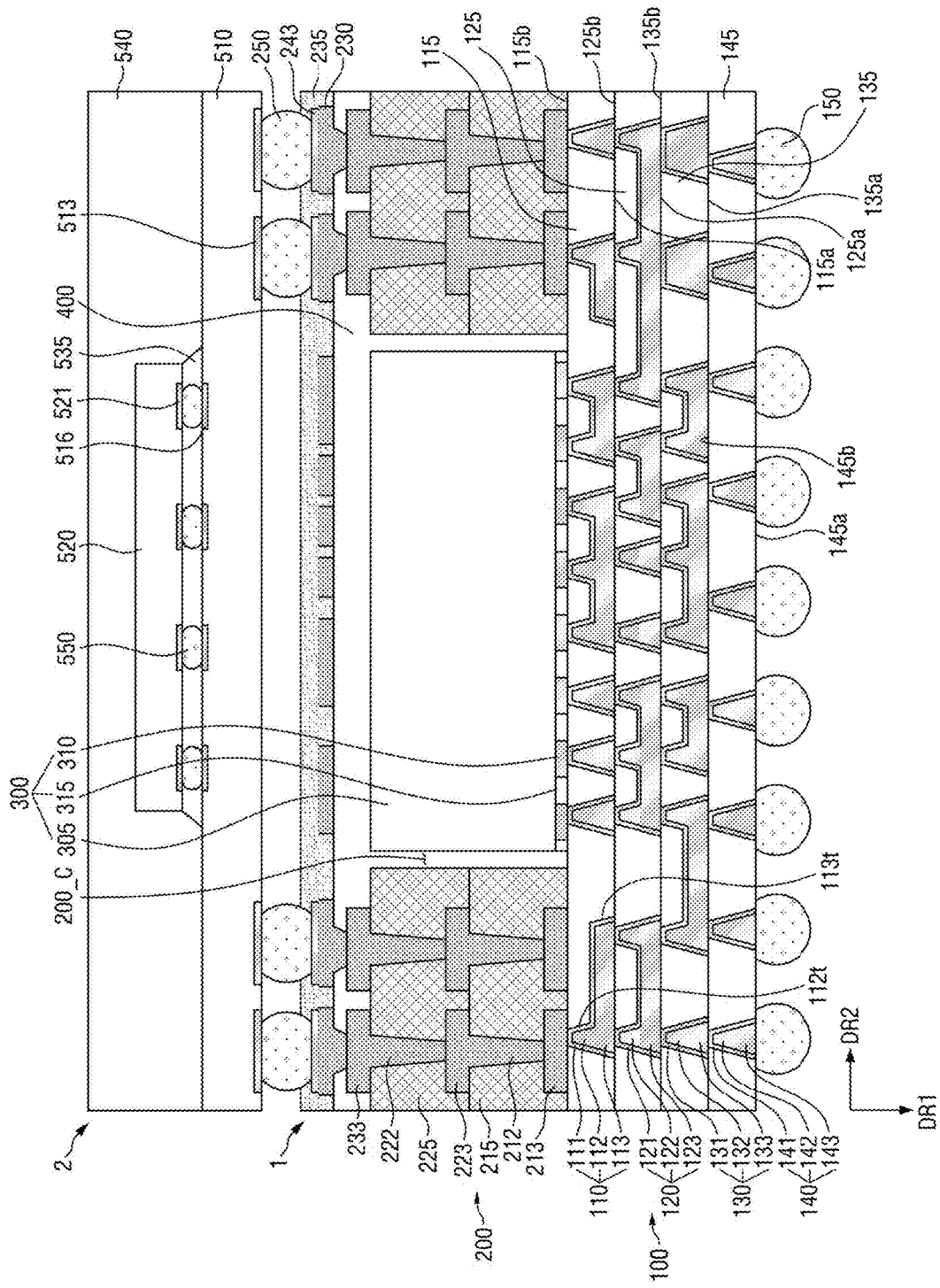
FIG. 17 is a diagram for explaining a semiconductor package according to example embodiments.

FIG. 17 is a diagram for explaining a semiconductor package according to example embodiments. For convenience of description, points different from those described referring to FIG. 4 will be mainly described.

Referring to FIG. 17, the semiconductor package according to some embodiments of the present disclosure may include a first semiconductor package 1 and a second semiconductor package 2. The first semiconductor package 1 may be one of the semiconductor packages described referring to FIGS. 1 to 4.

The first semiconductor package 1 may further include a fourth redistribution pattern 230, a second passivation layer 235 and a connection pad 243.

The fourth redistribution pattern 230 may be placed on the core layer 200 and the first molding layer 400. The fourth redistribution pattern 230 may penetrate the first molding layer 400 and be placed on the third core wiring layer 233. The fourth redistribution pattern 230 may be electrically connected to the core layer 200.

The fourth redistribution pattern 230 may include, for example, a conductive material. Accordingly, the fourth redistribution pattern 230 may be electrically connected to the redistribution structure 100 and the first semiconductor chip 300.

The second passivation layer 235 may be placed on the first molding layer 400 and the fourth redistribution pattern 230. The second passivation layer 235 may include, for example, an insulating material.

The connection pad 243 may be placed on the fourth redistribution pattern 230 exposed by the second passivation layer 235. The connection pad 243 may be formed by plating such as precious metal plating. The connection pad 243 may be formed by, for example, electrolytic gold plating, electroless gold plating, OSP or electroless tin plating, electroless silver plating, electroless nickel plating/substitution gold plating, DIG plating, HASL and the like. Therefore, the connection pad 243 may be electrically connected to the fourth redistribution pattern 230.

The second semiconductor package 2 may be placed on the first semiconductor package 1. The second semiconductor package 2 may be placed on the lower face of the first semiconductor package 1 in the first direction DR1.

The second semiconductor package 2 may include a substrate 510, a second semiconductor chip 520, a third solder ball 550, a first underfill material layer 535 and a second molding layer 540.

The substrate 510 may be, for example, a printed circuit board (PCB) or a ceramic substrate. However, the technical idea of the present disclosure is not limited thereto The substrate 510 may include a first conductive pad 513 and a second conductive pad 516. The first conductive pad 513 may be exposed from the upper face of the substrate 510 in the first direction DR1, and the second conductive pad 516 may be exposed from the lower face of the substrate 510 in the first direction DR1.

The second semiconductor chip 520 may be placed on the substrate 510. The second semiconductor chip 520 may be a memory chip. The memory chip may be, for example, a volatile memory semiconductor chip such as a DRAM (Dynamic Random Access Memory) or an SRAM (Static Random Access Memory), or a non-volatile memory semiconductor chip such a PRAM (Phase-change Random Access Memory), a MRAM (Magnetoresistive Random Access Memory), a FeRAM (Ferroelectric Random Access Memory) or a RRAM (Resistive Random Access Memory). The second semiconductor chip 520 may be, but is not limited to, a single semiconductor chip. For example, the second semiconductor chip 520 may be a stack of a plurality of memory semiconductor chips (Stack: All memory chips in the memory system taken together in one assembly, JEDEC Standard Definition). That is, the second semiconductor chip 520 may be formed by a plurality of slices (Slice: One memory chip in the stack of memory chips, JEDEC Standard Definition).

The second semiconductor chip 520 may include a second chip pad 521. The second chip pad 521 may be exposed from the upper face of the second semiconductor chip 520 in the first direction DR1.

A third solder ball 550 may be placed between the substrate 510 and the second semiconductor chip 520. The third solder ball 550 may be placed on the second chip pad 521 and the second conductive pad 516. This enables the second semiconductor chip 520 to be electrically connected to the substrate 510.

The first underfill material layer 535 may fill the space between the substrate 510 and the second semiconductor chip 520. The first underfill material layer 535 may wrap the third solder ball 550 between the substrate 510 and the second semiconductor chip 520, and may fill the space between the third solder balls 550.

The second molding layer 540 may be placed on the second semiconductor chip 520 and the substrate 510. The second molding layer 540 may cover the lower face and side faces of the second semiconductor chip 520, and the side faces of the first underfill material layer 535. The side faces of the second molding layer 540 may be continuous with the side faces of the substrate 510.

Alternatively, unlike that shown in this drawing, the second molding layer 540 may expose the lower face of the second semiconductor chip 520 in the first direction DR1. The lower face of the second molding layer 540 in the first direction DR1 may be placed on the same plane as the lower face of the second semiconductor chip 520 in the first direction DR1.

The second solder ball 250 may be placed between the first semiconductor package 1 and the second semiconductor package 2. The second solder ball 250 may be placed on the connection pad 243. The second solder ball 250 may be placed on the connection pad 243 and the first conductive pad 513 of the substrate 510. As a result, the second semiconductor package 2 may be electrically connected to the first semiconductor package 1.

The sizes and shapes of the first to third solder balls 150, 250 and 550 may be substantially the same as each other, or may be different from each other as shown in this drawing.

Figure 18:
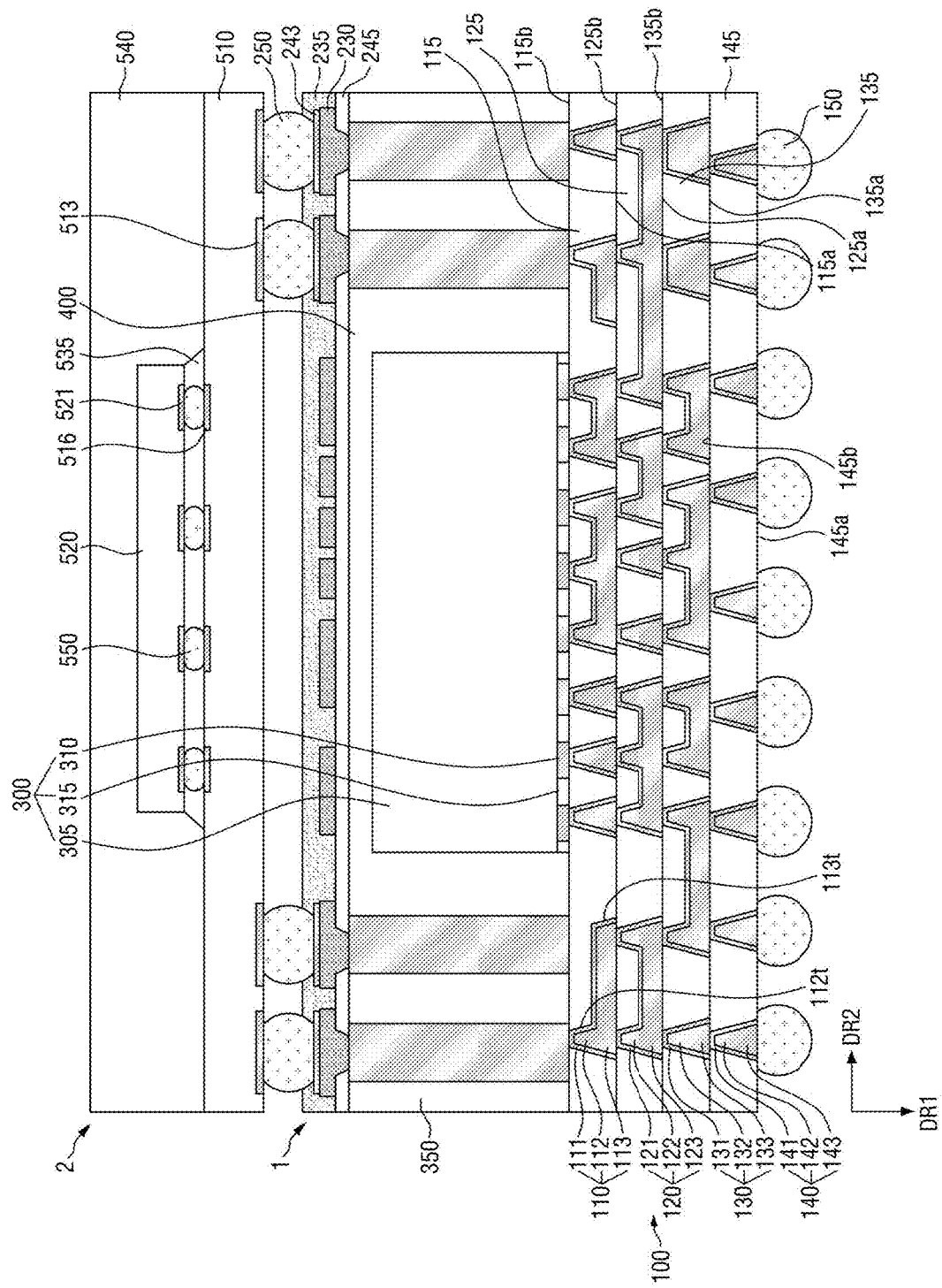
FIG. 18 is a diagram for explaining the semiconductor package according to example embodiments.

FIG. 18 is a diagram for explaining a semiconductor package according to example embodiments. For convenience of description, points different from those referring to FIG. 17 will be mainly described.

Referring to FIG. 18, in the semiconductor packages according to some other embodiments of the present disclosure, the first semiconductor package 1 may include a penetration via 350.

The penetration via 350 may penetrate the first molding layer 400 and be placed on the first via region 112 and the fourth via region 232. Therefore, the redistribution structure 100 and the fourth redistribution pattern 230 may be electrically connected to each other.

The fourth insulating layer 245 may be placed between the first molding layer 400 and the second passivation layer 235. The fourth via region 232 may penetrate the fourth insulating layer 245 to electrically connect the penetration via 350 and the fourth wiring region 233.

The first semiconductor package 1 may be formed by, for example, an RDL last process. The redistribution structure 100 may be formed on the surface of the first semiconductor chip 300 on which the first chip pad 310 is formed, and on the surface of the first molding layer 400. Therefore, the widths of the first to third via regions 112, 122 and 132 and the width of the UBM via 142 may gradually increase in the first direction DR1.

Figure 19:
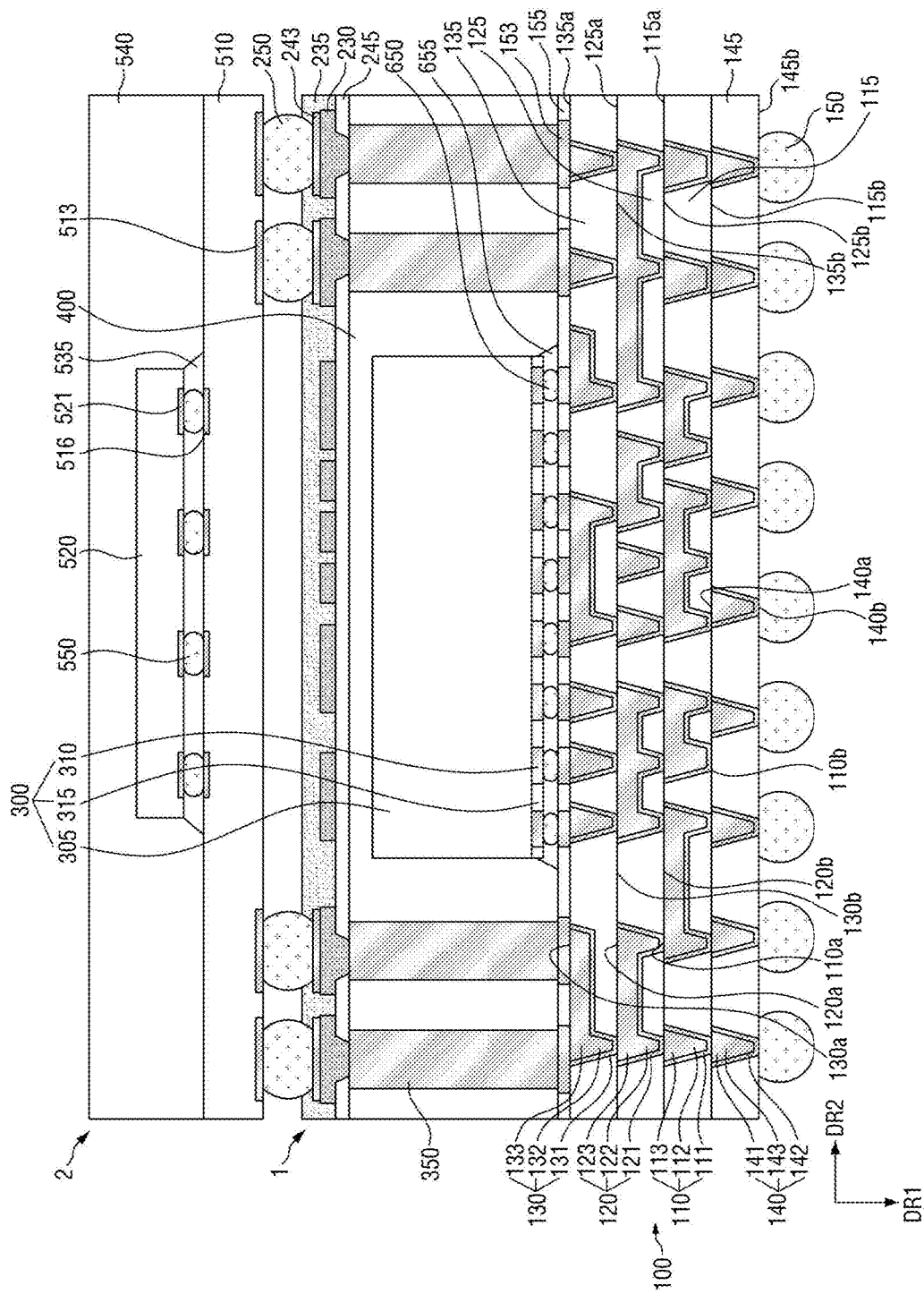
FIG. 19 is a diagram for explaining the semiconductor package according to example embodiments.

FIG. 19 is a diagram for explaining a semiconductor package according to example embodiments. For convenience of description, points different from those described referring to FIG. 18 will be mainly described.

Referring to FIG. 19, in the semiconductor packages according to some other embodiments of the present disclosure, the first semiconductor package 1 may be formed by, for example, an RDL first process. For example, the first passivation layer 145 and the first to the third insulating layers 115, 125 and 135 may be sequentially stacked and formed in the first direction, by being fixed by a wafer carrier or the like. Thereafter, the first semiconductor chip 300 may be mounted on the second face 110b of the first insulating layer 115. Therefore, the width of the first to third via regions 112, 122 and 132 and the width of the UBM via 142 may gradually decrease in the first direction DR1.

The first semiconductor package 1 may further include a third conductive pad 153 and a third passivation layer 155.

The third conductive pad 153 may be placed on the upper face 130a of the third wiring region 133. The third conductive pad 153 may be connected to the third redistribution pattern 130. The third passivation layer 155 may expose at least a part of the third conductive pad 153.

The penetration via 350 may penetrate the first molding layer 400 and be placed on the third wiring region 133 and the fourth via region 232. Therefore, the redistribution structure 100 and the fourth redistribution pattern 230 may be electrically connected to each other.

A fourth solder ball 650 may be placed between the first semiconductor chip 300 and the redistribution structure 100. The fourth solder ball 650 may be placed on the first chip pad 310 and the third conductive pad 153. Therefore, the first semiconductor chip 300 may be electrically connected to the redistribution structure 100.

The fourth solder ball 650 may have substantially the same size and shape as those of the first to third solder balls 150, 250 and 550, or may have different size and shape as shown in this drawing.

A second underfill material layer 655 may fill the space between the redistribution structure 100 and the first semiconductor chip 300. The second underfill material layer 655 may wrap a fourth solder ball 650 between the redistribution structure 100 and the first semiconductor chip 300, and may fill a space between the fourth solder balls 650.

Figure 20:
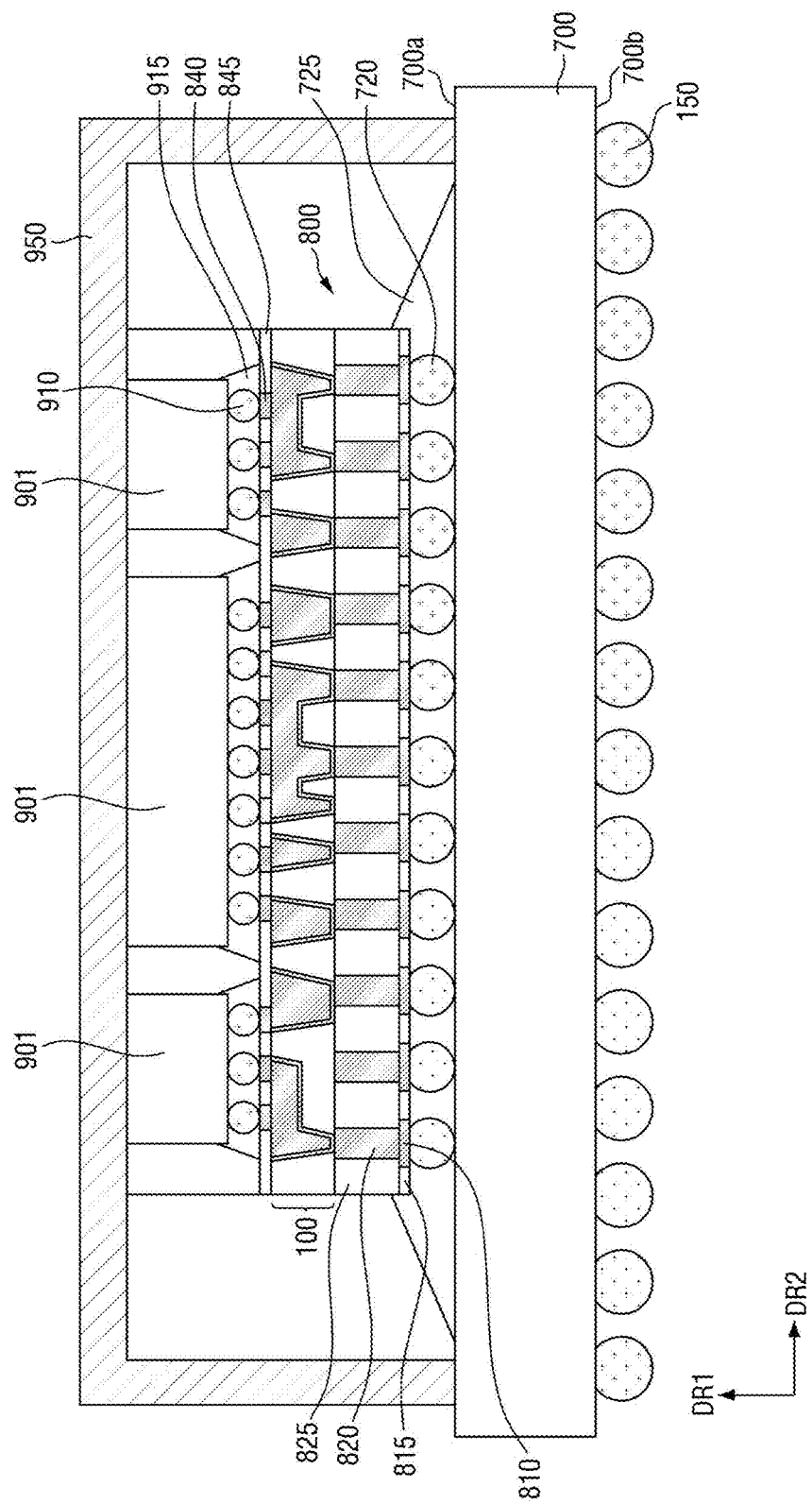
FIG. 20 is a diagram for explaining the semiconductor package according to example embodiments.

FIG. 20 is a diagram for explaining a semiconductor package according to example embodiments.

Referring to FIG. 20, a semiconductor package according to some other embodiments of the present disclosure may include a first substrate 700, a second substrate 800, first to third semiconductor chips 901, 902 and 903, and a hit slug 950.

The first substrate 700 may include a first face 700a and a second face 700b opposite to each other in the first direction DR1. The first solder balls 710 may be placed on the first face 700a of the first substrate 700. The first substrate 700 may be, for example, a PCB substrate.

The second substrate 800 may be placed on the second face 700b of the first substrate 700. The second substrate 800 may be, for example, an interposer substrate. The second substrate 800 may be connected to the first substrate 700 by the second solder balls 720. A first underfill material layer 725 may wrap the second solder ball 720 between the first substrate 700 and the second substrate 800, and may fill the space between the second solder balls 720.

The second substrate 800 may include a first connection pad 810, a first passivation layer 815, a penetration electrode 820, a substrate layer 825, a redistribution structure 100, a second connection pad 840 and a second passivation layer 845. The first passivation layer 815, the substrate layer 825, the redistribution structure 100 and the second passivation layer 845 may be sequentially stacked in the first direction DR1.

The first passivation layer 815 may expose at least a part of the first connection pad 810. A second solder ball 720 may be placed on the first connection pad 810.

The substrate layer 825 may be placed on the first passivation layer 815. The substrate layer 825 may include, for example, silicon. The penetration electrode 820 may penetrate the substrate layer 825 and be placed on the first connection pad 810 and the redistribution structure 100. This enables the substrate layer 825 to be electrically connected to the redistribution structure 100.

The redistribution structure 100 may be placed on the substrate layer 825. The redistribution structure 100 may be one of the redistribution structures described above referring to FIGS. 1 to 16.

The second passivation layer 845 may be placed on the redistribution structure 100. The second passivation layer 845 may expose at least a part of the second connection pad 840.

First to third semiconductor chips 901, 902 and 903 may be placed on the second passivation layer 845. The first to third semiconductor chips 901, 902 and 903 may be electrically connected to the second substrate 800 through the third solder balls 930. The second underfill material layer 935 may wrap the third solder ball 930 between the second substrate 800 and the first to third semiconductor chips 901, 902 and 903, and may fill the space between the third solder balls 930.

The first and third semiconductor chips 901 and 903 may be, for example, memory chips, and the second semiconductor chip 902 may be, for example, a semiconductor scale chip that performs a logic function.

A molding layer 940 may be placed on the second substrate 800. The molding layer 940 may cover the upper face of the second substrate 800 and the side faces of the first to third semiconductor chips 901, 902 and 903. The molding layer 940 may expose upper faces of the first to third semiconductor chips 901, 902 and 903.

A hit slug 950 may extend from one side to the other side of the first substrate 700. The hit slug 950 may be placed on the upper faces of the first to third semiconductor chips 901, 902 and 903 and the upper face of the molding layer 940.

While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. A semiconductor package comprising:
an insulating layer including a first face and a second face opposite each other;
a redistribution pattern including a wiring region and a via region in the insulating layer, the wiring region being on the via region; and
a first semiconductor chip connected to the redistribution pattern, the first semiconductor chip being on the redistribution pattern,
an upper face of the wiring region being coplanar with the first face of the insulating layer,
at least one of a first side wall of the redistribution pattern and a second side wall of the redistribution pattern has no step.

2. The semiconductor package of claim 1, wherein
the first side wall and second side wall are opposite each other,
the first side wall of the redistribution pattern and the second side wall of the redistribution pattern each extend in a thickness direction of the insulating layer.

3. The semiconductor package of claim 1, wherein the insulating layer is a single layer.

4. The semiconductor package of claim 1, wherein a lower face of the redistribution pattern is on a same plane as the second face of the insulating layer.

5. The semiconductor package of claim 1, further comprising:
a seed layer between the redistribution pattern and the insulating layer.

6. The semiconductor package of claim 5, wherein the seed layer extends along of a lower face of the via region.

7. The semiconductor package of claim 1, wherein
the first semiconductor chip is on the second face of the insulating layer, and
the wiring region is on the upper face of the via region.

8. The semiconductor package of claim 7, wherein a width of the via region gradually decreases in a direction from the first face of the insulating layer to the second face of the insulating layer.

9. The semiconductor package of claim 1, wherein
the first semiconductor chip is on the first face of the insulating layer, and
the wiring region is on the upper face of the via region.

10. The semiconductor package of claim 9, wherein a width of the via region gradually decreases in a direction from the first face of the insulating layer to the second face of the insulating layer.

11. The semiconductor package of claim 1, further comprising:
a molding layer; and
a penetration via; wherein
the first semiconductor chip is on the first face of the insulating layer, and
the molding layer is on the first face of the insulating layer and covers at least a part of the first semiconductor chip, and
the penetration via penetrates the molding layer and is connected to the redistribution pattern.

12. The semiconductor package of claim 1, further comprising:
a substrate layer on the second face of the insulating layer;
a penetration electrode penetrating the substrate layer and being connected to the redistribution pattern;
a second semiconductor chip on the first face of the insulating layer, the second semiconductor chip being different from the first semiconductor chip connected to the redistribution pattern,
the first semiconductor chip being on the first face of the insulating layer, and
the second semiconductor chip being connected to the first semiconductor chip through the redistribution pattern and the penetration electrode.

13. A semiconductor package comprising:
an insulating layer as a single layer, the insulating layer including a via trench and a wiring trench,
the via trench including a first side wall and a second side wall opposite each other,
the wiring trench including a third side wall and a fourth side wall opposite each other, the first to fourth side walls are inclined, and
at least one of the first side wall and the second side wall of the via trench placing on the same line as at least one of the third side wall and the fourth side wall of the wiring trench;
a redistribution pattern including a via region in the via trench and a wiring region in the wiring trench; and a semiconductor chip on the redistribution pattern and connected to the redistribution pattern.

14. The semiconductor package of claim 13, further comprising:
a seed layer between the redistribution pattern and the insulating layer,
the seed layer extending along the first side wall and the second side wall of the via trench, and
a bottom face of the seed layer being connected to the first side wall and the second side wall of the via trench and the third side wall and the fourth side wall of the wiring trench.

15. The semiconductor package of claim 13, wherein an upper face of the wiring region is on a same plane as an upper face of the insulating layer.

16. The semiconductor package of claim 13, wherein the insulating layer includes a photo imageable dielectric.

17. The semiconductor package of claim 13, wherein the insulating layer includes a first face and a second face opposite the first face,
the semiconductor chip is on the first face,
the semiconductor package further comprises:
an under bump metal layer including a UBM via and a UBM pad placed on the UBM via, on the second face of the insulating layer;
a passivation layer as a single layer, including a UBM via trench on which the UBM via is placed, and a UBM pad trench on which the UBM pad is placed; and
a solder ball connected to the UBM pad, on the passivation layer,
each of both side walls of the UBM via trench being directly connected to both side walls of the UBM pad trench.

18. The semiconductor package of claim 17, wherein the passivation layer includes a same material as the insulating layer.

19. A semiconductor package comprising:
a redistribution structure including a first face and a second face opposite each other,
the redistribution structure including a first insulating layer, a first redistribution pattern in the first insulating layer, a second insulating layer on the first insulating layer, and a second redistribution pattern in the second insulating layer,
the first redistribution pattern including a first via region and a first wiring region in the first insulating layer, the first via region being on the first wiring region,
the second redistribution pattern including a second via region and a second wiring region in the second insulating layer, the second via region being on the second wiring region and connected to the first wiring region,
in a direction from the second face toward the first face, an upper face of the first wiring region being coplanar with the first face of the first insulating layer, in the direction from the second face toward the first face, an upper face of the second wiring region being coplanar with the upper face of the second insulating layer, and
the first insulating layer and the second insulating layer each being a single layer, and
the first insulating layer and the second insulating layer including a photo imageable dielectric;
a core layer on the second face of the redistribution structure,
the core layer including a core wiring layer, a core insulating layer wrapping around the core wiring layer, and a cavity exposing at least a part of the second face of the redistribution structure;
a semiconductor chip in the cavity of the core layer and connected to the redistribution structure, the first via region being connected to the semiconductor chip; and
a solder ball on the second face of the redistribution structure.

20. The semiconductor package of claim 19, further comprising:
a passivation layer on the second face of the redistribution structure, the passivation layer including a same material as the first insulating layer and the second insulating layer; and
an under-bump metal layer including a UBM via and a UBM pad in the passivation layer, the UBM via being on the UBM pad and connected to the second wiring region, in the direction from the second face toward the first face,
an upper face of the UBM pad being coplanar with an upper face of the passivation layer, and
the solder ball being connected to the UBM pad.

* * * * *